(12) United States Patent
Abhinav et al.

(10) Patent No.: US 12,358,142 B2
(45) Date of Patent: Jul. 15, 2025

(54) GENERATING ROBOTIC ASSEMBLY INSTRUCTIONS FROM THREE-DIMENSIONAL COMPUTER-AIDED DESIGN MODELS

(71) Applicant: Accenture Global Solutions Limited, Dublin (IE)

(72) Inventors: Kumar Abhinav, Hazaribag (IN); Alpana Dubey, Bangalore (IN); Shubhashis Sengupta, Bangalore (IN); Piyush Goenka, Bangalore (IN)

(73) Assignee: Accenture Global Solutions Limited, Dublin (IE)

( * ) Notice: Subject to any disclaimer, the term of this patent is extended or adjusted under 35 U.S.C. 154(b) by 267 days.

(21) Appl. No.: 18/208,968

(22) Filed: Jun. 13, 2023

(65) Prior Publication Data

US 2024/0416520 A1    Dec. 19, 2024

(51) Int. Cl.
*B25J 9/16*    (2006.01)

(52) U.S. Cl.
CPC ............. *B25J 9/1671* (2013.01); *B25J 9/161* (2013.01); *B25J 9/163* (2013.01); *B25J 9/1687* (2013.01)

(58) Field of Classification Search
CPC . B25J 9/161; B25J 9/163; B25J 9/1671; B25J 9/1687; G06F 30/17; G06F 30/27; G06N 3/045; G06N 3/08
See application file for complete search history.

(56) References Cited

U.S. PATENT DOCUMENTS

| | | | |
|---|---|---|---|
| 9,956,655 B2 | 5/2018 | Yamamoto | |
| 2017/0066092 A1* | 3/2017 | Yamamoto | G06F 30/17 |
| 2017/0180756 A1* | 6/2017 | Tuffreau | H04N 13/161 |
| 2019/0243338 A1* | 8/2019 | Golway | G06F 30/20 |
| 2021/0357545 A1* | 11/2021 | Sugawara | G06F 30/12 |
| 2021/0370513 A1* | 12/2021 | Dai | B25J 9/1697 |

(Continued)

OTHER PUBLICATIONS

Kipf et al., "Semi-Supervised Classification With Graph Convolutional Networks," arXiv:1609.02907v4 [cs.LG], Published as Conference Paper in ICLR, Feb. 22, 2017, 14 Pages.

(Continued)

*Primary Examiner* — Wade Miles
*Assistant Examiner* — Zachary Joseph Wallace
(74) *Attorney, Agent, or Firm* — POLSINELLI PC

(57) ABSTRACT

A device may receive a three-dimensional (3D) computer-aided design (CAD) model, and may generate an assembly graph with nodes that represent components and edges that represent contact between the components. The device may generate component graphs for the components, and may generate an assembly descriptor based on the assembly graph and the component graphs. The device may process the assembly descriptor, with a graph convolution network model, to generate node embeddings, and may apply pooling to the node embeddings to generate graph embeddings. The device may calculate a cross attention between the components to generate component interrelations, and may utilize the graph embeddings and the component interrelations to predict links between the components. The device may predict poses and joint axes for the components, and may generate assembly instructions based on the graph embeddings, the component interrelations, the links, the poses, and the joint axes.

20 Claims, 19 Drawing Sheets

(56) References Cited

U.S. PATENT DOCUMENTS

| | | | |
|---|---|---|---|
| 2022/0055213 A1* | 2/2022 | Kang | G05B 17/02 |
| 2022/0172107 A1* | 6/2022 | Butterfoss | B25J 9/1687 |
| 2023/0249345 A1* | 8/2023 | Sivanath | B25J 9/1661 |
| | | | 700/264 |
| 2023/0267248 A1* | 8/2023 | Reinhart | G06F 30/12 |
| | | | 703/1 |
| 2023/0306150 A1* | 9/2023 | Kodama | G06F 30/12 |
| 2024/0354471 A1* | 10/2024 | Sawyer | G06F 30/27 |
| 2024/0403503 A1* | 12/2024 | Tsemach | B27M 3/18 |

OTHER PUBLICATIONS

Velickovic et al., "Graph Attention Networks," arXiv:1710.10903v3 [stat.ML], Published as Conference Paper in ICLR, Feb. 4, 2018, 12 Pages.

Tian et al., "Assemble Them All: Physics-Based Planning for Generalizable Assembly by Disassembly," ACM Trans. Graph., vol. 41, No. 6, Article 278. Publication date: Dec. 2022, 15 Pages.

European Search Report for EP Application No. 24181358, dated Oct. 25, 2024, 8 pages.

Upadhyay, et al. (2022), "3D-DSPNET: Product Disassembly Sequnence Planning," IEEE International Conference on Multimedia and Expo Workshop (ICMEW), Jul. 18, 2022, 6 pages.

Willis, et al. (2022), "JoinABLe: Learnin Bottom-up Assembly of Parametric CAD Joints," IEEE/CVF Conference on Computer Vision and Patten Recognition (CVPR) Jun. 18, 2022, pp. 15828-15839.

Gajek, et al., (2021), "A Recommendation System for CAD Assembly Modeling Based on Graph Neural Networks," Advances in Visual Computing: 16th International Symposium, ISVC 2021, Virtual Event, Oct. 4-6, 2021, pp. 457-473.

Yao, et al. (2022), "Computer-Aided Assembly Sequence Planning for High-Mix Low-Volume Products in the Electronic Appliances Industry," CPSL—Conference on Production systems and Logistics, May 31, 2022, 10 pages.

Hou, et al. (2023), "FuS-GCN: Efficient B-rep based graph convolutional networks for 3D-CAD model classification and retrieval," Advanced Engineering Informatics, Elsevier, Amsterdam, NL, Apr. 1, 2023, vol. 56, 12 pages.

* cited by examiner

GENERATING ROBOTIC ASSEMBLY INSTRUCTIONS FROM THREE-DIMENSIONAL COMPUTER-AIDED DESIGN MODELS

BACKGROUND

Automating tasks using robotic devices depends on programming the robotic devices correctly. For example, during an assembly process, a robotic arm should be programmed to move into position to grasp an item correctly and then move the item into a correct position. In another example, during an assembly process, a robotic drill should be programmed to move into position to tighten a fastener, such as a screw or bolt.

SUMMARY

Some implementations described herein relate to a method. The method may include receiving a three-dimensional (3D) computer-aided design (CAD) model, and generating an assembly graph with nodes that represent components of the 3D CAD model and edges that represent contact between the components. The method may include generating component graphs for each component of the assembly graph, and generating an assembly descriptor based on the assembly graph and the component graphs. The method may include processing the assembly descriptor, with a graph convolution network model, to generate node embeddings, and applying pooling to the node embeddings to generate graph embeddings. The method may include calculating, based on the graph embeddings, a cross attention between the components to generate component interrelations, and utilizing the graph embeddings and the component interrelations to predict links between the components. The method may include predicting poses and joint axes for the components based on the graph embeddings, the component interrelations, and the links, and generating assembly instructions based on the graph embeddings, the component interrelations, the links, the poses, and the joint axes. The method may include causing the assembly instructions to be implemented by a robotic device to assemble an object represented by the 3D CAD model.

Some implementations described herein relate to a device. The device may include one or more memories and one or more processors coupled to the one or more memories. The one or more processors may be configured to receive a 3D CAD model, and generate an assembly graph with nodes that represent components of the 3D CAD model and edges that represent contact between the components. The one or more processors may be configured to generate component graphs for each component of the assembly graph, and generate an assembly descriptor based on the assembly graph and the component graphs, where the assembly descriptor includes the component graphs and corresponding adjacency matrices. The one or more processors may be configured to process the assembly descriptor, with a graph convolution network model, to generate node embeddings, and apply pooling to the node embeddings to generate graph embeddings. The one or more processors may be configured to calculate, based on the graph embeddings, a cross attention between the components to generate component interrelations, and utilize the graph embeddings and the component interrelations to predict links between the components. The one or more processors may be configured to predict poses and joint axes for the components based on the graph embeddings, the component interrelations, and the links, and generate assembly instructions based on the graph embeddings, the component interrelations, the links, the poses, and the joint axes. The one or more processors may be configured to cause the assembly instructions to be implemented by a robotic device to assemble an object represented by the 3D CAD model.

Some implementations described herein relate to a non-transitory computer-readable medium that stores a set of instructions. The set of instructions, when executed by one or more processors of a device, may cause the device to receive a 3D CAD model, and generate an assembly graph with nodes that represent components of the 3D CAD model and edges that represent contact between the components. The set of instructions, when executed by one or more processors of the device, may cause the device to generate component graphs for each component of the assembly graph, where each of the component graphs includes one or more nodes representing one or more faces of a corresponding component and one or more edges connecting the one or more nodes representing the one or more faces. The set of instructions, when executed by one or more processors of the device, may cause the device to generate an assembly descriptor based on the assembly graph and the component graphs, and process the assembly descriptor, with a graph convolution network model, to generate node embeddings. The set of instructions, when executed by one or more processors of the device, may cause the device to apply pooling to the node embeddings to generate graph embeddings, and calculate, based on the graph embeddings, a cross attention between the components to generate component interrelations. The set of instructions, when executed by one or more processors of the device, may cause the device to utilize the graph embeddings and the component interrelations to predict links between the components, and predict poses and joint axes for the components based on the graph embeddings, the component interrelations, and the links. The set of instructions, when executed by one or more processors of the device, may cause the device to generate assembly instructions based on the graph embeddings, the component interrelations, the links, the poses, and the joint axes, and cause the assembly instructions to be implemented by a robotic device to assemble an object represented by the 3D CAD model.

DETAILED DESCRIPTION

Figure 1A:
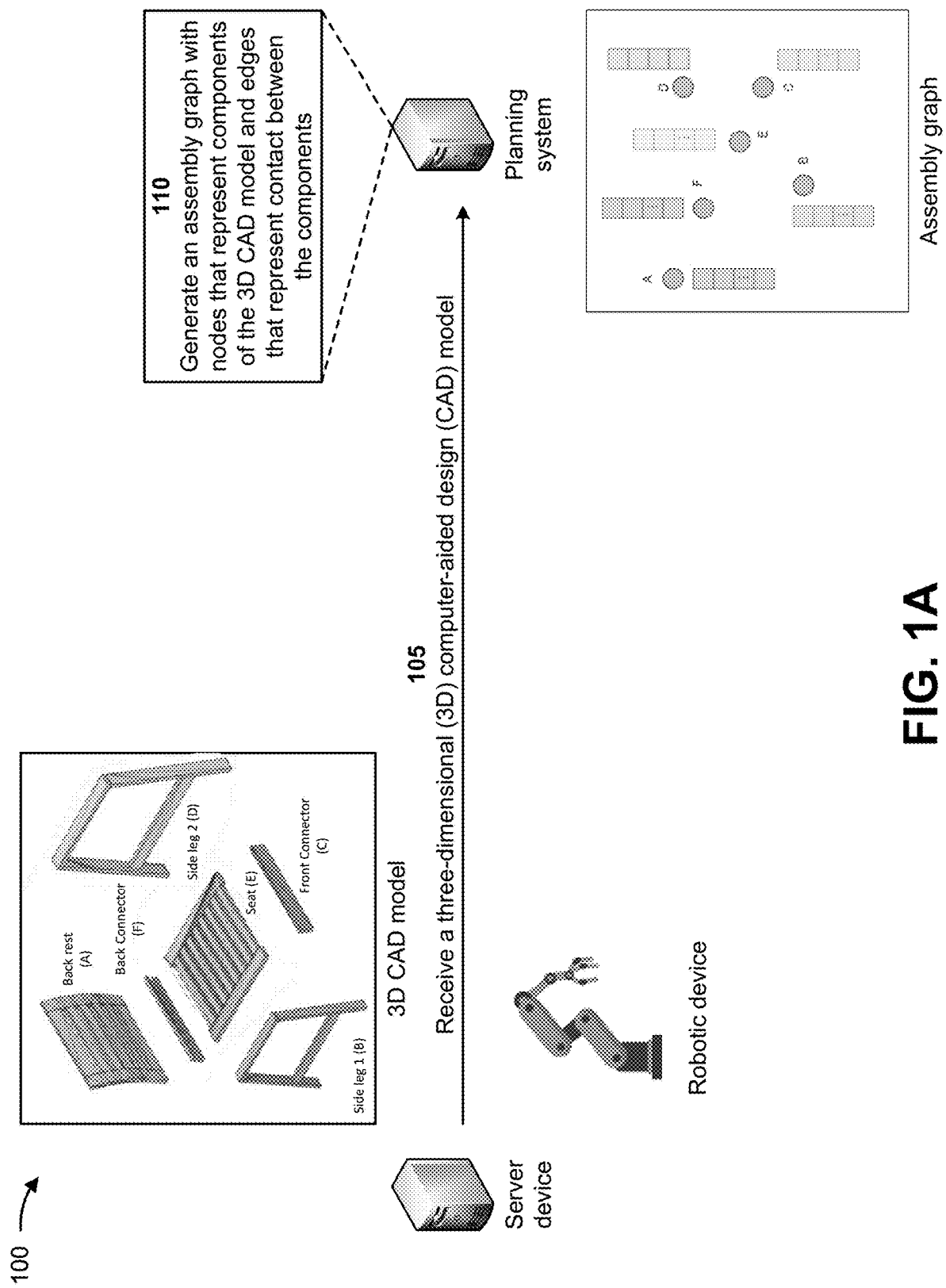
FIGS. 1A-1M are diagrams of an example implementation described herein.

The following detailed description of example implementations refers to the accompanying drawings. The same reference numbers in different drawings may identify the same or similar elements.

Programming a robotic device to assemble an object is a time-consuming process. For example, a computer may refine programming code, for the robotic device, across multiple iterations based on user input, which consumes power and processing resources each time the programming code is adjusted. Furthermore, the programming code may be debugged over multiple test iterations, and the computer consumes power and processing resources each time the programming code is re-compiled and re-tested.

Additionally, automated techniques for generating robotic instructions often consume significant amounts of power and processing resources. For example, using augmented reality (AR) markers when recording a video of an assembly process provides significant amounts of data from which programming code, for the robotic device, may be generated. However, determining significant amounts of data using the AR markers consumes significant amounts of power, processing resources, and memory space. In another example, using motion sensors, along with particular coordinate markers, similarly provides data from which programming code, for the robotic device, may be generated. However, determining significant amounts of data using the motion sensors also consumes significant amounts of power, processing resources, and memory space.

Furthermore, generating robotic instructions typically relies on profiles of items used during an assembly process. For example, existing data structures regarding screws, bolts, and other items used during the assembly process allow the robotic device to properly grasp and manipulate the items used during the assembly process. However, generating profiles of the items in advance is a time-consuming process. Additionally, because generating the profiles may depend on capturing and processing scans of the items, power and processing resources are also consumed in generating the profiles.

Therefore, current techniques for generating robotic assembly instructions consume computing resources (e.g., processing resources, memory resources, communication resources, and/or the like), networking resources, and/or the like associated with generating and refining programming code for the robotic assembly instructions over multiple iterations, utilizing significant augmented reality and motion sensor resources to generate robotic assembly instructions, generating profiles of objects to be assembled, and/or the like.

Some implementations described herein relate to a planning system that generates robotic assembly instructions from three-dimensional (3D) computer-aided design (CAD) models. For example, the planning system may receive a 3D CAD model, and may generate an assembly graph with nodes that represent components of the 3D CAD model and edges that represent contact between the components. The planning system may generate component graphs for each component of the assembly graph, and may generate an assembly descriptor based on the assembly graph and the component graphs. The planning system may process the assembly descriptor, with a graph convolution network model, to generate node embeddings, and may apply pooling to the node embeddings to generate graph embeddings. The planning system may calculate, based on the graph embeddings, a cross attention between the components to generate component interrelations, and may utilize the graph embeddings and the component interrelations to predict links between the components. The planning system may predict poses and joint axes for the components based on the graph embeddings, the component interrelations, and the links, and may generate assembly instructions based on the graph embeddings, the component interrelations, the links, the poses, and the joint axes. The planning system may cause the assembly instructions to be implemented by a robotic device to assemble an object represented by the 3D CAD model.

In this way, the planning system generates robotic assembly instructions from 3D CAD models. For example, the planning system may provide a data-driven learning model that utilizes 3D CAD models of separate components of an object to generate an efficient and feasible assembly plan and pose values for the components. The planning system may utilize a 3D CAD model of the object to obtain component information, and may process the component information, with a set of models, to generate the assembly plan for the object. This, in turn, conserves computing resources, networking resources, and/or the like that would otherwise have been consumed in generating and refining programming code for the robotic assembly instructions over multiple iterations, utilizing significant augmented reality and motion sensor resources to generate robotic assembly instructions, generating profiles of objects to be assembled, and/or the like.

FIGS. 1A-1M are diagrams of an example 100 associated with generating robotic assembly instructions from 3D CAD models. As shown in FIGS. 1A-1M, example 100 includes a server device and a robotic device associated with a planning system. The planning system may include a system that generates robotic assembly instructions from 3D CAD models. Further details of the server device, the robotic device, and the planning system are provided elsewhere herein.

As shown in FIG. 1A, and by reference number 105, the planning system may receive a 3D CAD model. For example, the server device may store a 3D CAD model of an object for which assembly instructions are to be generated. The assembly instructions may include instructions that, when executed by the robotic device, may cause the robotic device to assemble the object. The 3D CAD model may include a functional virtual prototype of 3D objects (e.g., components of a chair). The 3D CAD model may enable designers to dynamically create and modify every detail of the object. In some implementations, the server device may provide the 3D CAD model to the planning system, and the planning system may receive the 3D CAD model from the server device. The planning system may store the 3D CAD model in a data structure (e.g., a database, a table, a list, and/or the like) associated with the planning system.

As further shown in FIG. 1A, and by reference number 110, the planning system may generate an assembly graph with nodes that represent components of the 3D CAD model and edges that represent contact between the components. For example, the planning system may utilize the 3D CAD model to determine information identifying components (e.g., parts of the chair, such as a back rest, side legs, a seat, a back connector, and a front connector) of the object. The planning system may utilize the information identifying the components to generate the assembly graph. The assembly graph may include nodes of that represent the components of the object (e.g., the 3D model) and edges that represent contact (e.g., connections) between the components. For example, a back rest of the chair may be represented by node A, a first side leg may be represented by node B, a front connector may be represented by node C, a second side leg may be represented by node D, a seat may be represented by node E, a back connector may be represented by node F, and/or the like. In some implementations, the nodes of the assembly graph may not initially include any discrete features. An edge of the assembly graph, located between any two nodes, may be categorized into a no edge type when there is no contact relation between the components represented by the nodes, a hard edge type when there is a direct contact between the components represented by the nodes, and/or the like.

Figure 1B:
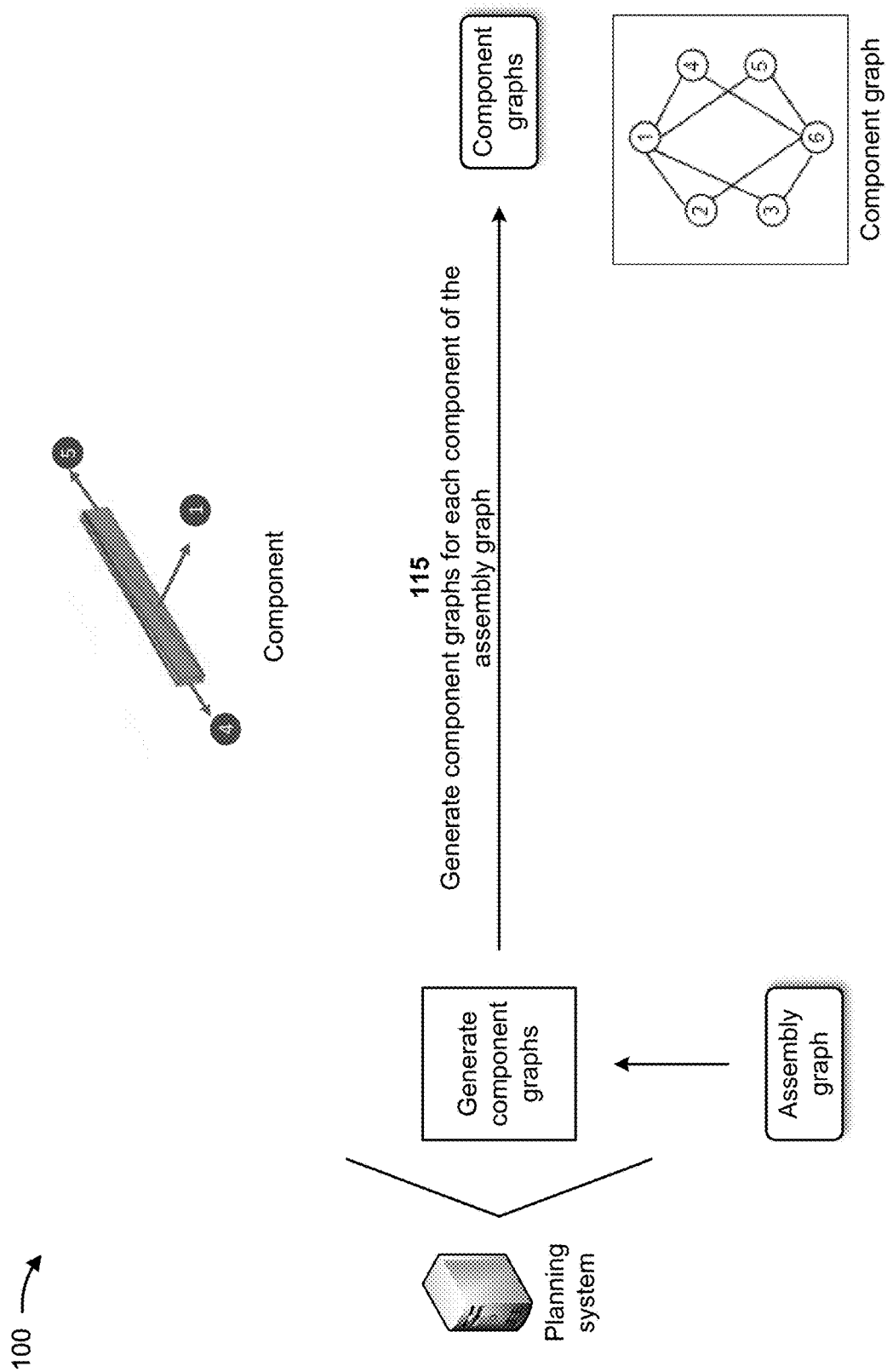

As shown in FIG. 1B, and by reference number 115, the planning system may generate component graphs for each component (e.g., node) of the assembly graph. For example, each component (e.g., node) of the assembly graph may include one or more faces and one or more connections between the one or more faces. For each component, the planning system may generate a component graph that includes nodes representing the one or more faces of the component and edges representing the one or more connections between the one or more faces. For example, the front connector of the chair may include six faces (e.g., front, back, top, bottom, left side, and right side) and eight connections between the six faces. In such an example, the planning system may generate a component graph (e.g., for the front connector of the chair) that includes six nodes and eight edges (e.g., links) provided between the nodes. Thus, each node of the assembly graph may be represented by a component graph that includes nodes and edges.

In some implementations, each node (e.g., face) of a component graph may include a set of features, such as spatial features, structural features, and/or the like. A spatial feature may include a vertex spatial position (P). The structural features may include a vertex normal ($N_v$), a Gaussian curvature (gc), a face normal (NA), angles between a face and the face's one-ring neighborhood faces (θ), and/or the like. The Gaussian curvature may be determined as follows:

$$gc = \frac{\left(2\pi - \sum_{j \in N(i)} \theta_j\right)}{A_N(i)},$$

where the angle $\theta_i$ is in an angle set and is an angle between normal (n) of two faces:

$$\theta_i = \frac{\vec{n}_{f_i} \cdot \vec{n}_{f_j}}{n_{f_i} \cdot n_{f_j}},$$

where a normal in the normal set ($N_v$) is mathematically defined as:

$$\vec{n}_{v_i} = \sum_{j \in F_V(i)} A_j \vec{n}_{f_j}.$$

Figure 1C:
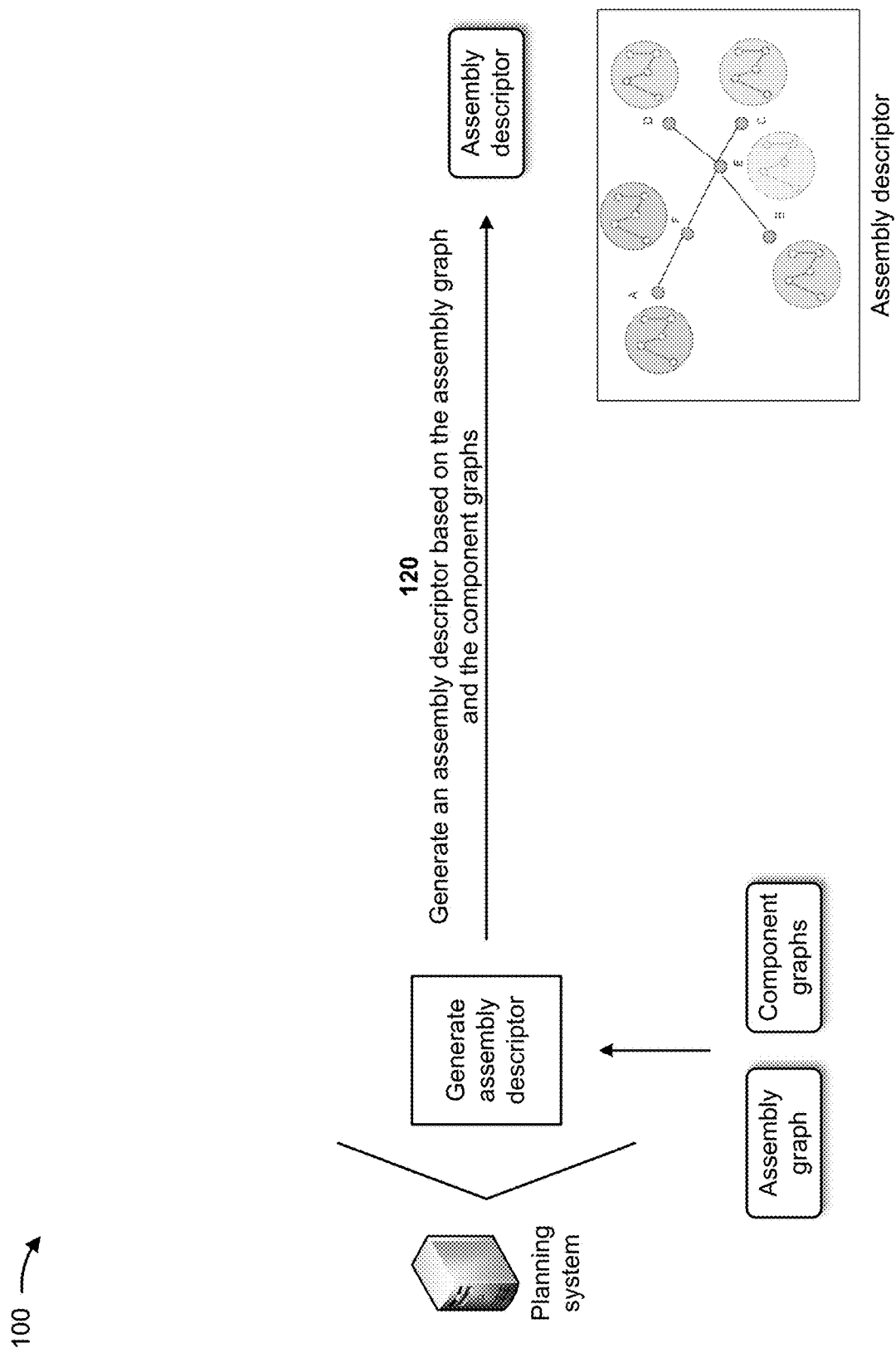

As shown in FIG. 1C, and by reference number 120, the planning system may generate an assembly descriptor based on the assembly graph and the component graphs. For example, the planning system may combine the component graphs together, based on the assembly graph (e.g., where the nodes of the assembly graph correspond to the component graphs), to generate the assembly descriptor. In some implementations, the assembly descriptor includes the component graphs and corresponding adjacency matrices. Each component graph may be represented by a corresponding adjacency matrix. An adjacency matrix (e.g., a connection matrix) of a component graph (e.g., a labeled graph) may include a matrix with rows and columns labeled by graph vertices $v_i$ and $v_j$, with a one or a zero in position ($v_i$, $v_j$) according to whether $v_i$ and $v_j$ are adjacent or not.

Figure 1D:
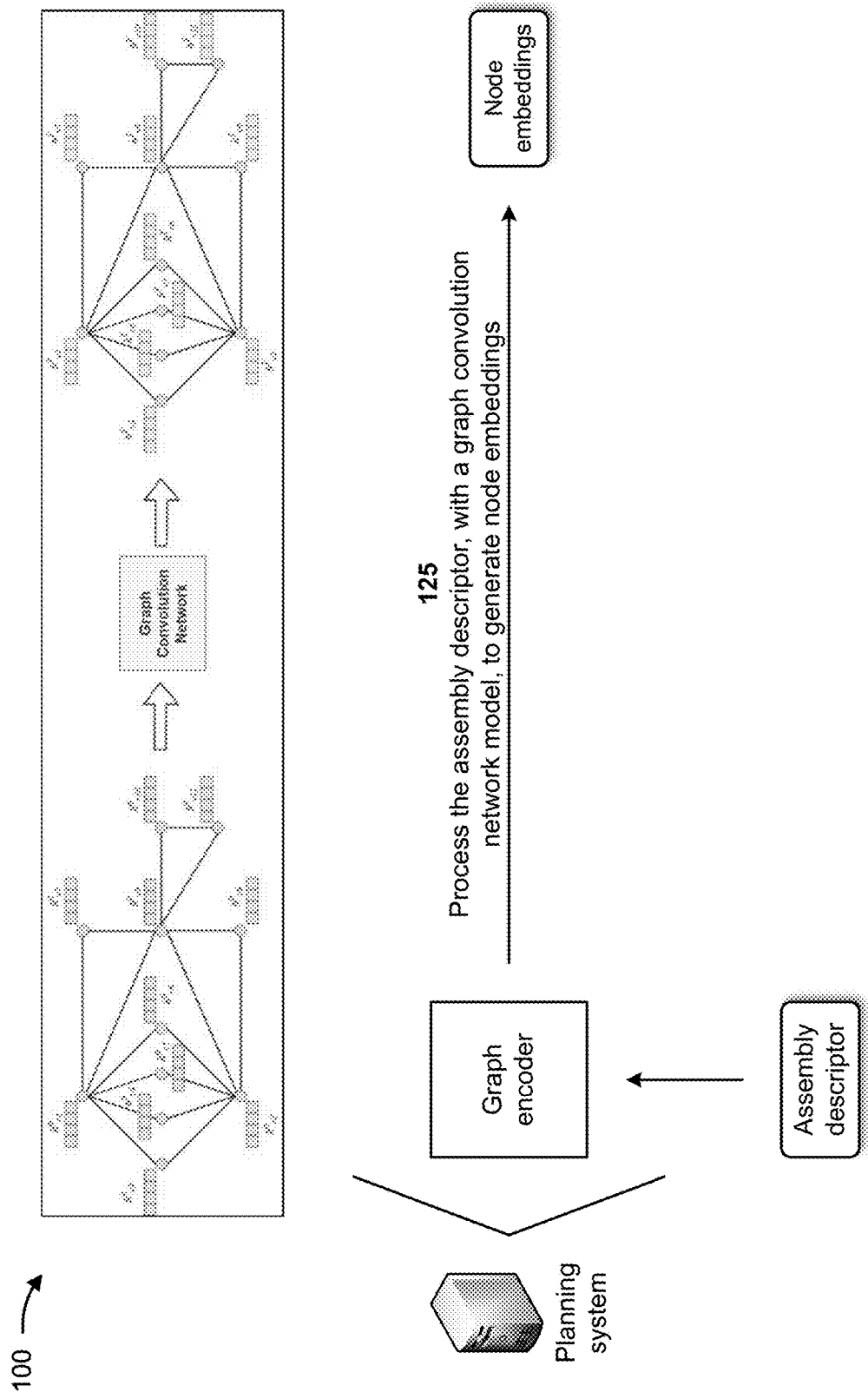

As shown in FIG. 1D, and by reference number 125, the planning system may process the assembly descriptor, with a graph convolution network model, to generate node embeddings. For example, the planning system may be associated with a graph convolution network model with multiple graph convolution layers. The graph convolution network model may generate updated node features (e.g., node embeddings) of an input graph (e.g., the assembly descriptor). The graph convolution network model may include a first part with first convolution layers (e.g., S-layers) and a second part with second convolution layers (e.g., T-layers) that are different than the first convolution layers. In some implementations, the assembly descriptor includes the component graphs, and when processing the assembly descriptor with the graph convolution network model to generate the node embeddings, the planning system may encode features of the component graphs of the assembly descriptor to generate the node embeddings. Further details of the graph convolution network model are provided below in connection with FIGS. 1E-1G and 2.

Figure 1E:
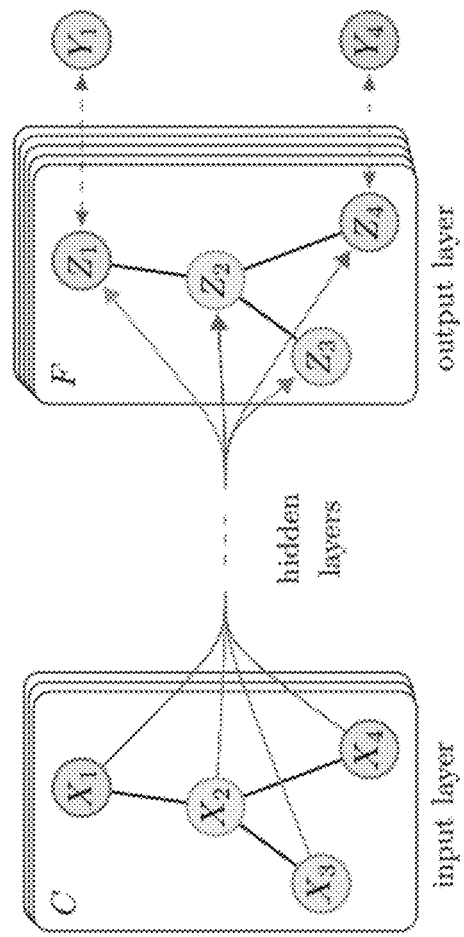
Figure 1E:
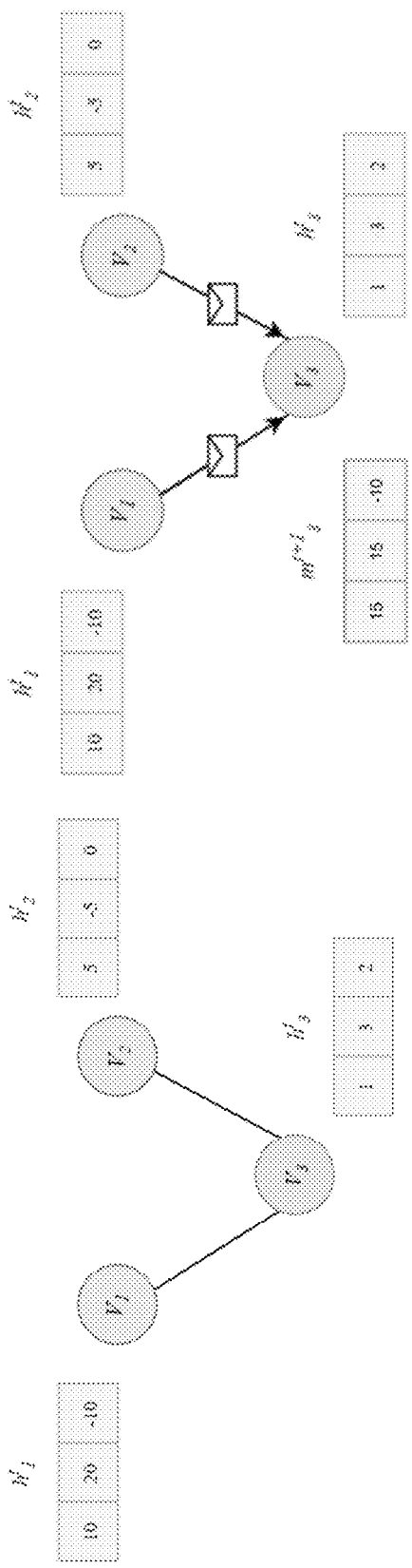

The top of FIG. 1E depicts a multi-layered graph convolution network. For example, a two-layer graph convolution network may include an input layer and output layer. The input layer may include a quantity (C) of input channels and the output layer may include a quantity (F) of feature maps. An input to the two-layer graph convolution network may include a graph represented as G (X, A), where X is a feature embedding of nodes in the graph and A is an adjacency matrix. The bottom left of FIG. 1E depicts message (m) passing for a node ($v_3$) at step t, where N (v) is a set of adjacent nodes of v, h is a hidden state of a node, and:

$$m_v^{t+1} = \sum_{w \in N(v)} h_w^t, \quad h_v^{t+1} = \text{average}(h_v, m_v^{t+1}).$$

The bottom right of FIG. 1E depicts messages being passed from nodes $v_1$ and $v_2$ to node $v_3$ and a resultant adjacency matrix $m_v^{t+1}$ (e.g., 15, 15, and −10) generated based on the messages.

Figure 1F:
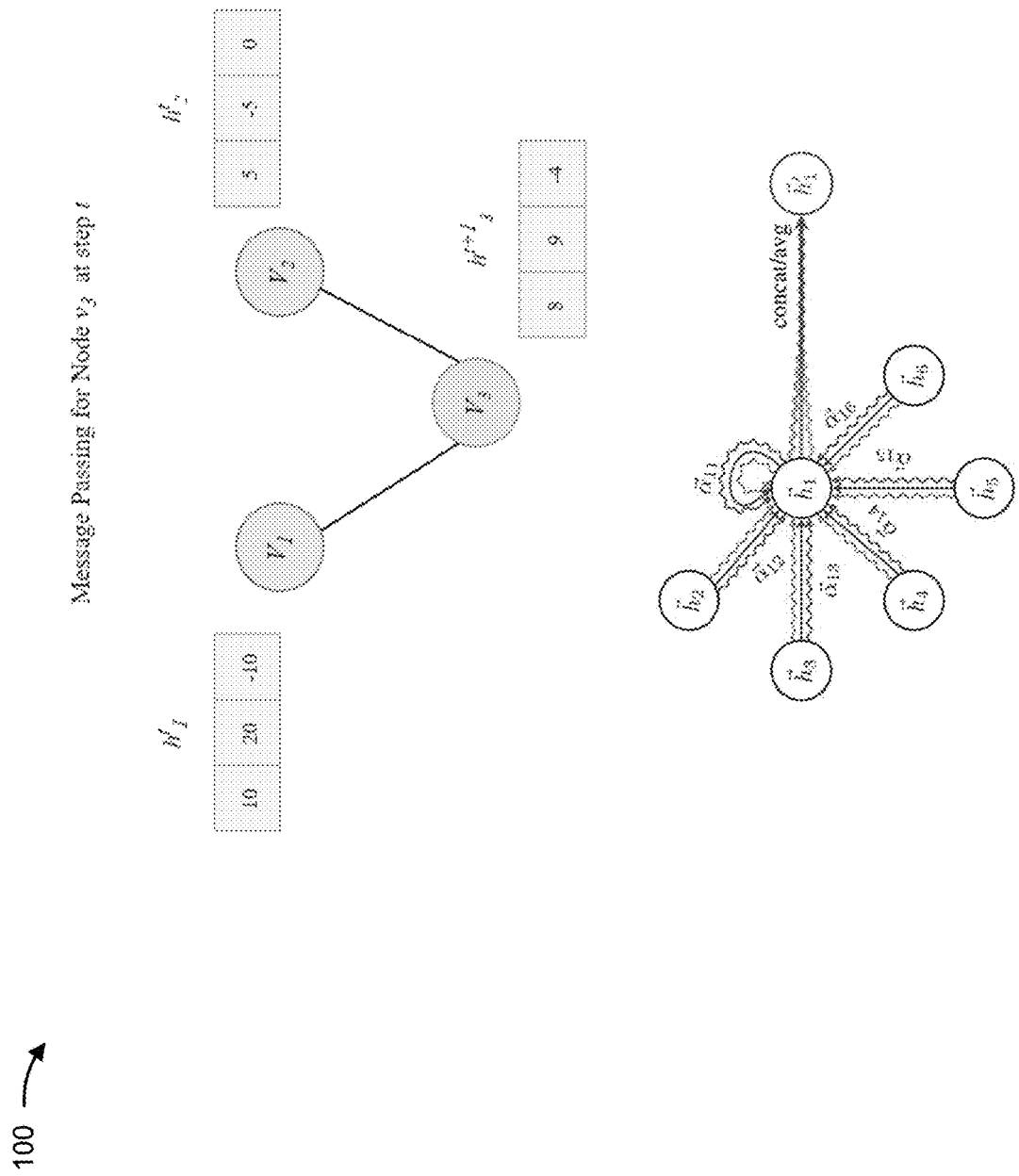

The top of FIG. 1F depicts averaging the adjacency matrices (e.g., 15, 15, −10) and (e.g., 1, 3, 2) to generate a final adjacency matrix $h_v^{t+1}$ (e.g., 8, 9, −4). The bottom of FIG. 1F depicts how every neighborhood node i of node 1 (e.g., $h_1$) sends features with attention coefficients $\alpha_{ij}^k$ for each attention head k. Head k features from each adjacent node may be aggregated to obtain next-level features of node 1 (e.g., $h_1$) as follows:

$$\vec{h}_i' = \|_{k=1}^K \sigma\left(\sum_{j \in N_i} \alpha_{ij}^k W^k \vec{h}_j\right).$$

Figure 1G:
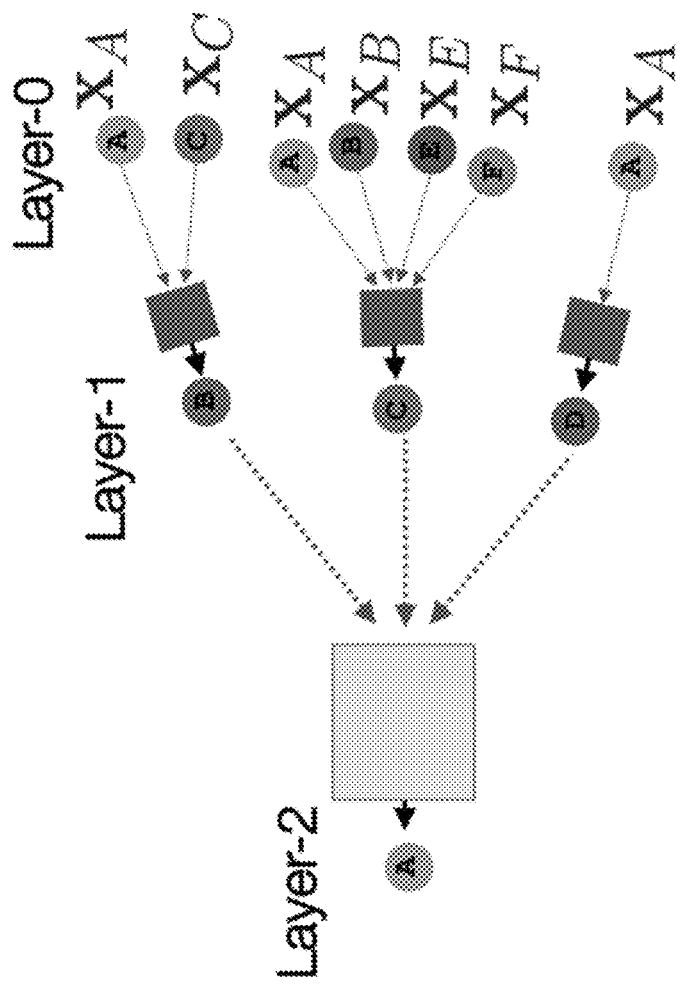
Figure 1G:
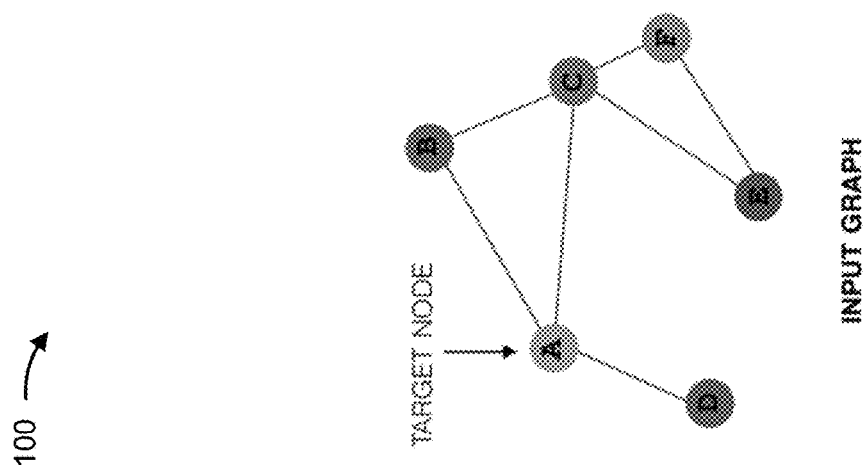

FIG. 1G depicts a message passing network of the two-layer graph convolution network. A graph represented as G (X, A) may be provided to the message passing network, where X is a feature embedding of nodes in the graph and A is an adjacency matrix. As shown, the features of nodes A and C may be passed to node B in a first layer, the features of nodes A, B, E, and F may be passed to node C in the first layer, and the features of node A may be passed to node D in the first layer. The features of nodes B, C, and D may be passed to node A in a second layer.

Figure 1H:
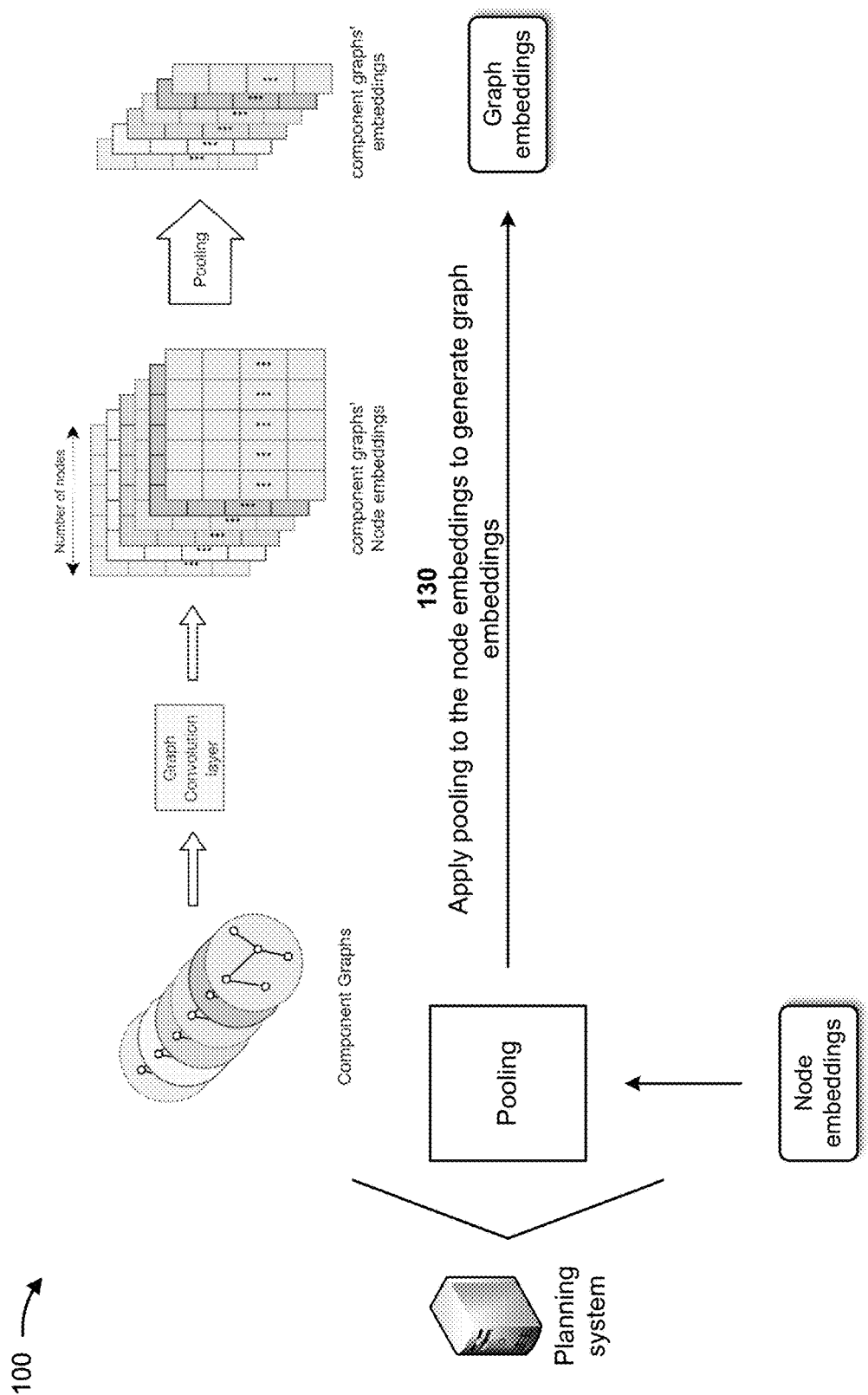

As further shown in FIG. 1H, and by reference number 130, the planning system may apply pooling to the node embeddings to generate graph embeddings. For example, the planning system may utilize the first convolution layers (e.g., the S-layers) of the graph convolution network model to encode features of the component graphs into component graph embeddings (e.g., the node embeddings). The node embeddings may be utilized as features of assembly graph nodes. The planning system may apply a type of pooling to the node embeddings to generate the graph embeddings. In some implementations, when applying the pooling to the node embeddings to generate the graph embeddings, the planning may apply average pooling to the node embeddings to generate the graph embeddings, may apply maximum pooling to the node embeddings to generate the graph embeddings, may apply minimum pooling to the node embeddings to generate the graph embeddings, and/or the like.

In some implementations, each node (e.g., component) of the assembly graph may include a feature vector that represents the component. The planning system may pass the assembly graph the second convolution layers (e.g., the T-layers) of the graph convolution network model to obtain an updated set of node features. In some implementations, the planning system may utilize a recurrent neural network model (e.g., a long short-term memory (LSTM) model, a gated recurrent units (GRU) model, and/or the like) to aggregate messages in the message passing network. The recurrent neural network model may receive a hidden state of an aggregated message from a previous step and an input graph, and may generate a new hidden state of the aggregated message and an output graph with updated node embeddings.

Figure 1I:
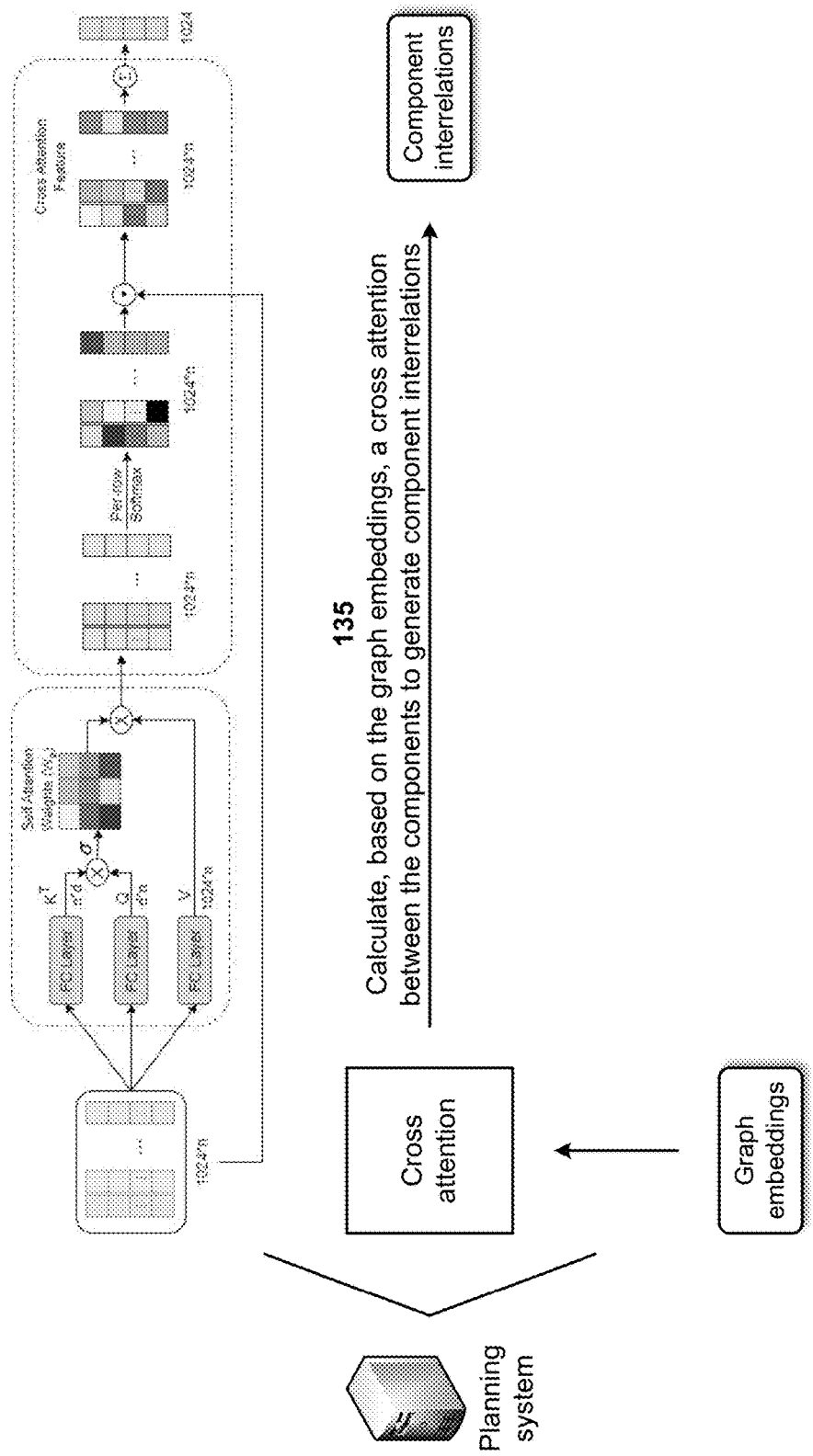

As shown in FIG. 1I, and by reference number 135, the planning system may calculate, based on the graph embeddings, a cross attention between the components to generate component interrelations. For example, the planning system may capture relations between the components (e.g., component interrelations) by computing a cross attention between the components based on the graph embeddings. Given component feature vectors, the planning system may focus on the most informative descriptors and may generate a single feature vector that captures the interrelation between the parts. For example, given component feature vectors (Fa), the planning system may learn a self-attention feature map, using the scaled dot-product attention, which transforms each part features into a self-attention vector. Thus, Fa may be transformed into three feature sub-spaces Q, K, and V, as follows:

$$Q = W_q F_a, K = W_k F_a, V = W_v F_a,$$

where $W_q$, $W_k$, and $W_v$ are learning weight matrices of dimension d*d (e.g., d=1024), and the self-attention weights are computed as:

$$W_a = \sigma\left(\frac{QK^T}{\sqrt{d}}\right).$$

The planning system may aggregate the self-attention feature vectors into a matrix Sa, as follows:

$$S_a = W_a V.$$

The planning system may apply Softmax per row in order to transform the matrix Sa into a weight (e.g., probability) vector. The planning system may compute an element-wise dot product between the component feature and the self-attention vector, as follows:

$$F = F_a \odot S_a.$$

The planning system may sum the weighted features to produce the output feature vector fa, as follows:

$$(f_a)_i = \sum_{j=1}^{n} F_{ij}.$$

Figure 1J:
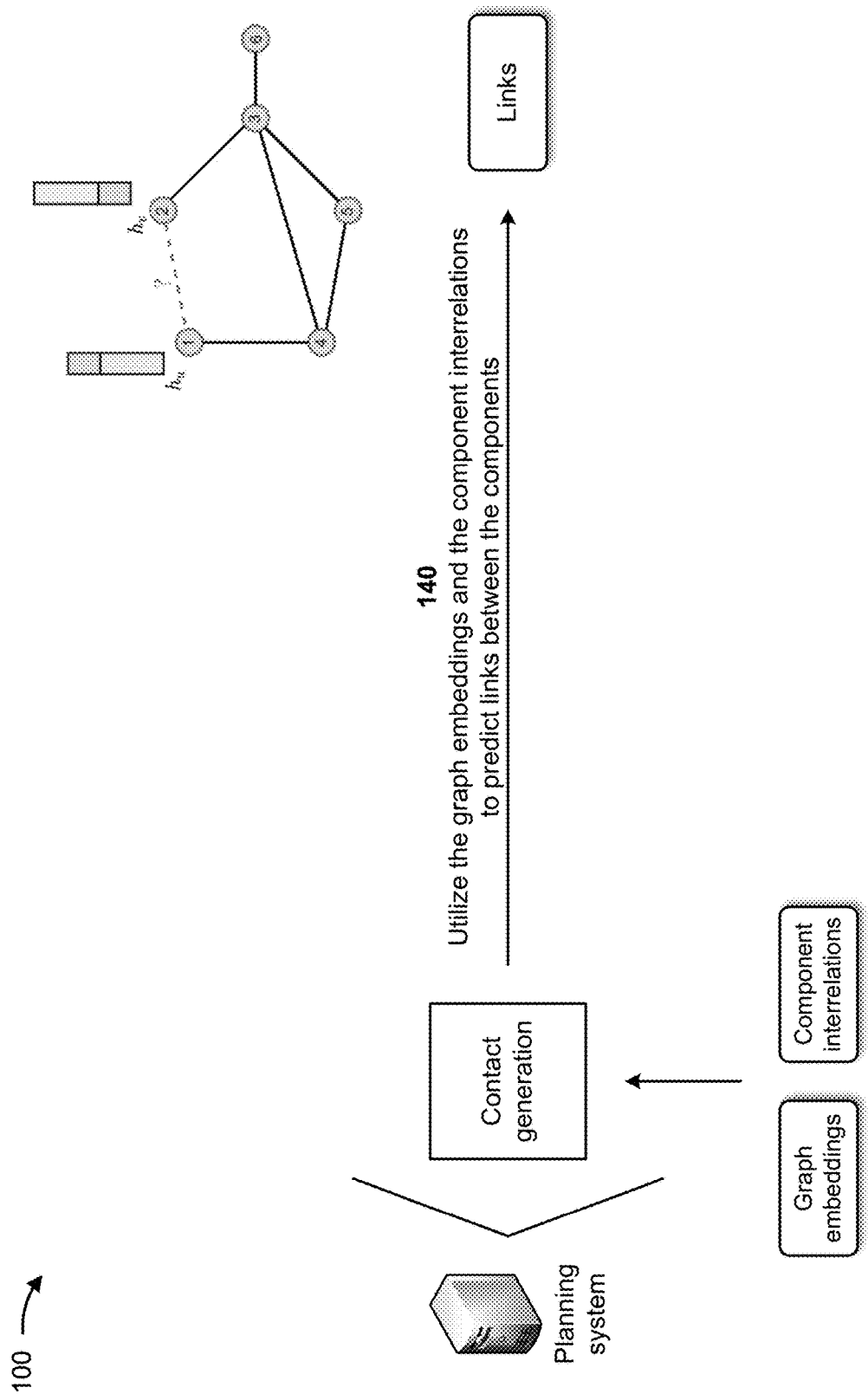

As shown in FIG. 1J, and by reference number 140, the planning system may utilize the graph embeddings and the component interrelations to predict links between the components. For example, when utilizing the graph embeddings and the component interrelations to predict the links between the components, the planning system may process the graph embeddings and the component interrelations, with a link prediction model or a link classification model, to predict the links (e.g., contact) between the components. The planning system may model the link (e.g., contact) generation problem as a link prediction problem or a link classification problem in a graph. The planning system may predict the links using pairs of node embeddings by applying some prediction head ( ) as follows:

$$\hat{y} = \text{Head}_{edge}(h_u, h_v),$$

where the prediction head may be determined utilizing concatenation and a multi-layer perceptron (MLP) classifier or a dot product (e.g., $y=(h_v)^T h_u$).

Figure 1K:
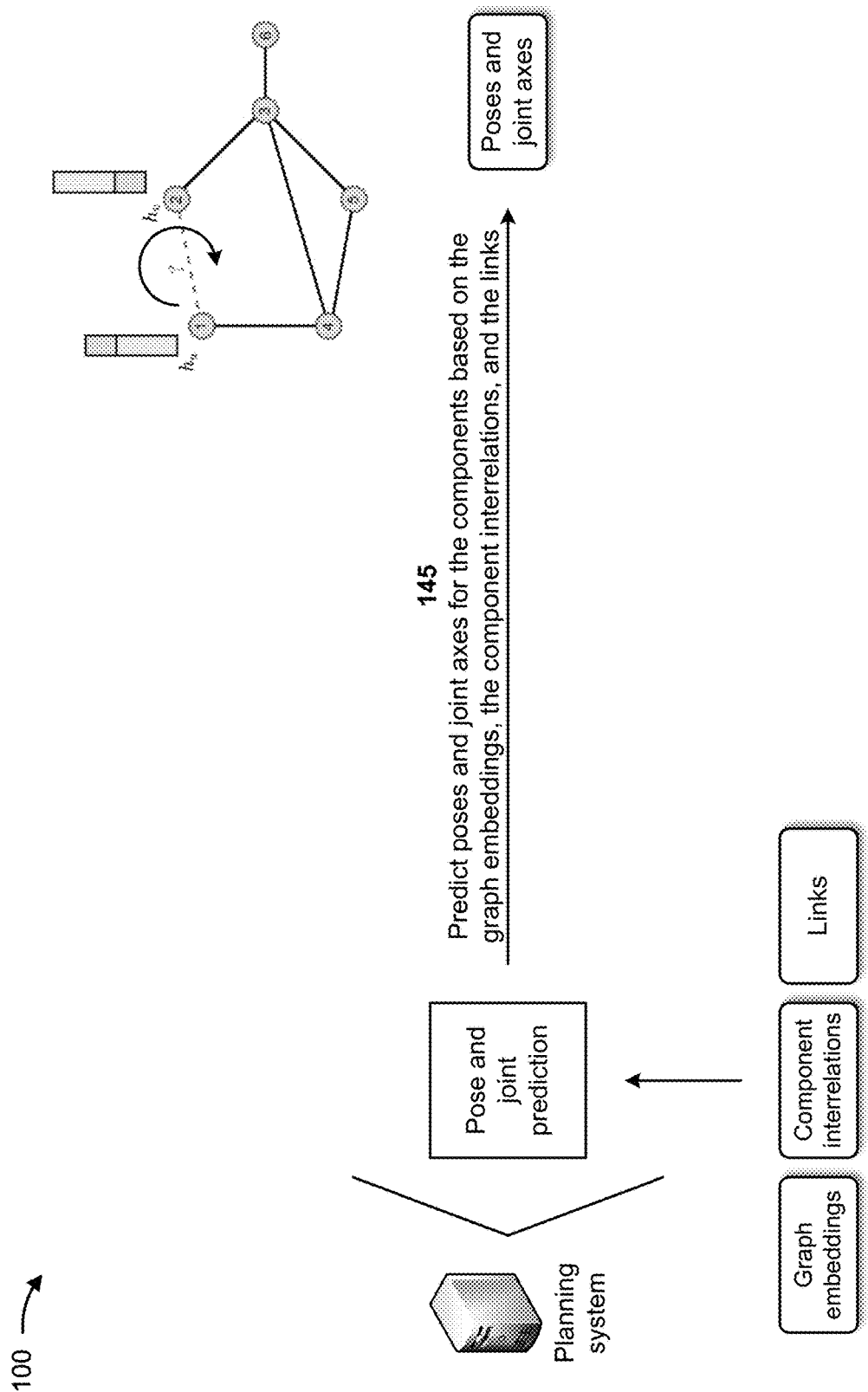

As shown in FIG. 1K, and by reference number 145, the planning system may predict poses and joint axes for the components based on the graph embeddings, the component interrelations, and the links. For example, the planning system may regress translation, rotation, and joint axis prediction using combination of a Euclidean norm (e.g., L2) and chamfer distance loss terms. The planning system may utilize an MLP for predicting six degrees of freedom pose for each component. In some implementations, the planning system may represent joint axes as unit vectors in 3D space (e.g., three standard unit vectors i, j, and k, along the x-axis, the y-axis, and z-axis, respectively). The planning system may express any direction as scaler multiples of standard unit vectors in form, and may normalize any direction (a) for unit magnitude, as follows:

$$a = (a_1, a_2, a_3) = a_1 i + a_2 j + a_3 k.$$

The planning system may align every 3D assembly (e.g., the object) along a principal axis (e.g., direction) in 3D space.

Figure 1L:
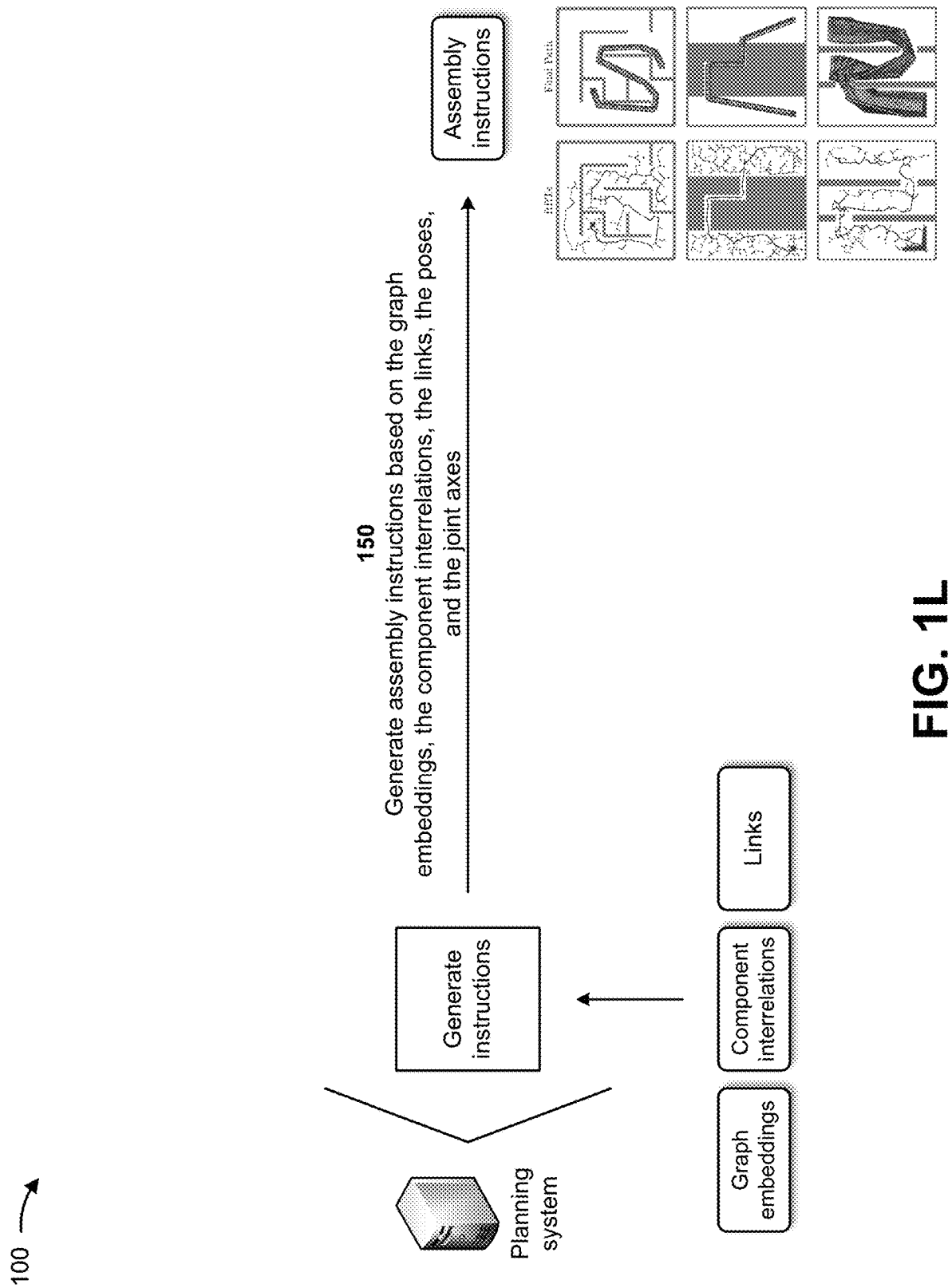

As shown in FIG. 1L, and by reference number 150, the planning system may generate assembly instructions based on the graph embeddings, the component interrelations, the links, the poses, and the joint axes. For example, the planning system may generate assembly instructions, for the robotic device (e.g., including one or more robotic machines) for each action of a plurality of actions, based on the graph embeddings, the component interrelations, the links, the poses, and the joint axes. For example, the planning system may generate assembly instructions for the robotic device to grip each component of the object, associated with an action represented in the assembly instructions, and manipulate the component according to the sets of coordinates associated with the component and the action. By iteratively generating assembly instructions, according to the sequence of actions and components of the object, the planning system generates assembly instructions for the robotic device to assemble the object from the components according to the 3D CAD model.

In some implementations, the planning system may apply rapidly exploring random trees to the assembly instructions (e.g., for robotic motion planning), where the actions represented in the assembly instructions are associated with state transitions (e.g., a plurality of state transitions). For example, the action may represent a state transition for component associated with the action from an initial state (before the action) to a final state (after action). Accordingly, the sequence of actions represented in the assembly instructions may correspond to a sequence of state transitions. The planning system may begin at an initial state associated with a first action represented in the assembly instructions and iteratively attempt to reduce a distance from the initial state to a final state associated with an ultimate action represented in the assembly instructions. The planning system thus applies rapidly exploring random trees to iteratively find a shortest (at least locally) path of assembly instructions through the sequence of actions. The planning system may therefore generate machine-level instructions, corresponding to the state transitions, based on the graph embeddings, the component interrelations, the links, the poses, and the joint axes.

Figure 1M:
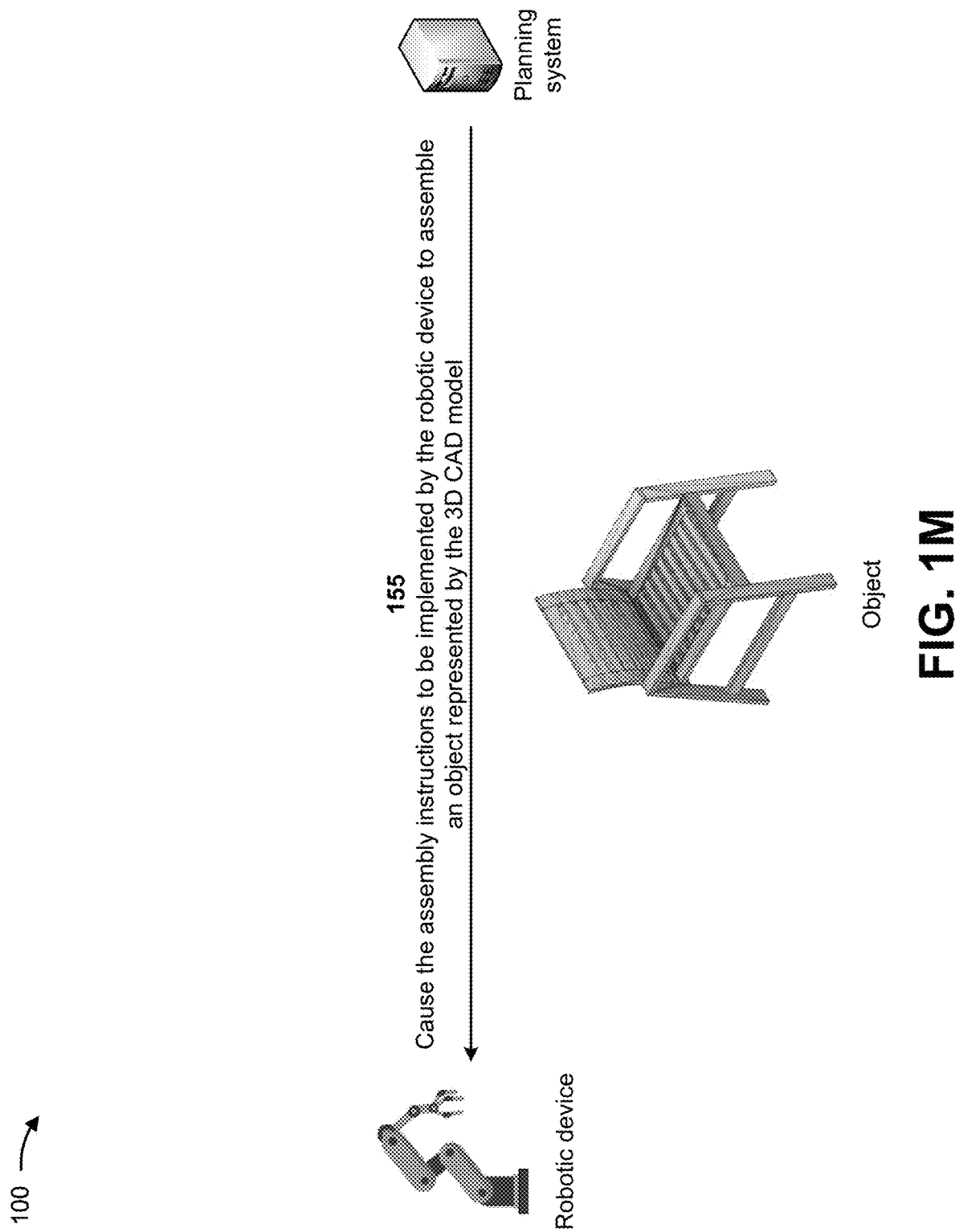

As shown in FIG. 1M, and by reference number 155, the planning system may cause the assembly instructions to be implemented by the robotic device to assemble an object represented by the 3D CAD model. For example, the planning system may provide the assembly instructions to the robotic device and may instruct the robotic device to execute the assembly instructions. The robotic device may execute the assembly instructions and may assembly the object represented by the 3D CAD model based on executing the assembly instructions. For example, the planning system may transmit the instructions as commands to the robot device. Accordingly, the robot device may perform an assembly process corresponding to the 3D CAD model. In some implementations, the planning system may transmit the assembly instructions to program the robotic device. Accordingly, the robotic device may perform the assembly process over and over (e.g., in a factory setting or another assembly-line-like setting) according to the assembly instructions. For example, an operator of the robotic device may trigger the robotic device to repeatedly perform the assembly process according to the assembly instructions. In some implementations, the robotic device may perform the assembly process each time the robotic device receives a trigger (e.g., from the operator) or may repeat the assembly process according to a schedule. The schedule may be preconfigured (e.g., with a timed interval between each performance of the assembly process) or may be sensor-based (e.g., with each performance of the assembly process being triggered by movement of an assembly line or another type of environmental trigger).

In this way, the planning system generates robotic assembly instructions from 3D CAD models. For example, the planning system may provide a data-driven learning model that utilizes 3D CAD models of separate components of an object to generate an efficient and feasible assembly plan and pose values for the components. The planning system may utilize a 3D CAD model of the object to obtain component information, and may process the component information, with a set of models, to generate the assembly plan for the object. This, in turn, conserves computing resources, networking resources, and/or the like that would otherwise have been consumed in generating and refining programming code for the robotic assembly instructions over multiple iterations, utilizing significant augmented reality and motion sensor resources to generate robotic assembly instructions, generating profiles of objects to be assembled, and/or the like.

As indicated above, FIGS. 1A-1M are provided as an example. Other examples may differ from what is described with regard to FIGS. 1A-1M. The number and arrangement of devices shown in FIGS. 1A-1M are provided as an example. In practice, there may be additional devices, fewer devices, different devices, or differently arranged devices than those shown in FIGS. 1A-1M. Furthermore, two or more devices shown in FIGS. 1A-1M may be implemented within a single device, or a single device shown in FIGS. 1A-1M may be implemented as multiple, distributed devices. Additionally, or alternatively, a set of devices (e.g., one or more devices) shown in FIGS. 1A-1M may perform one or more functions described as being performed by another set of devices shown in FIGS. 1A-1M.

Figure 2A:
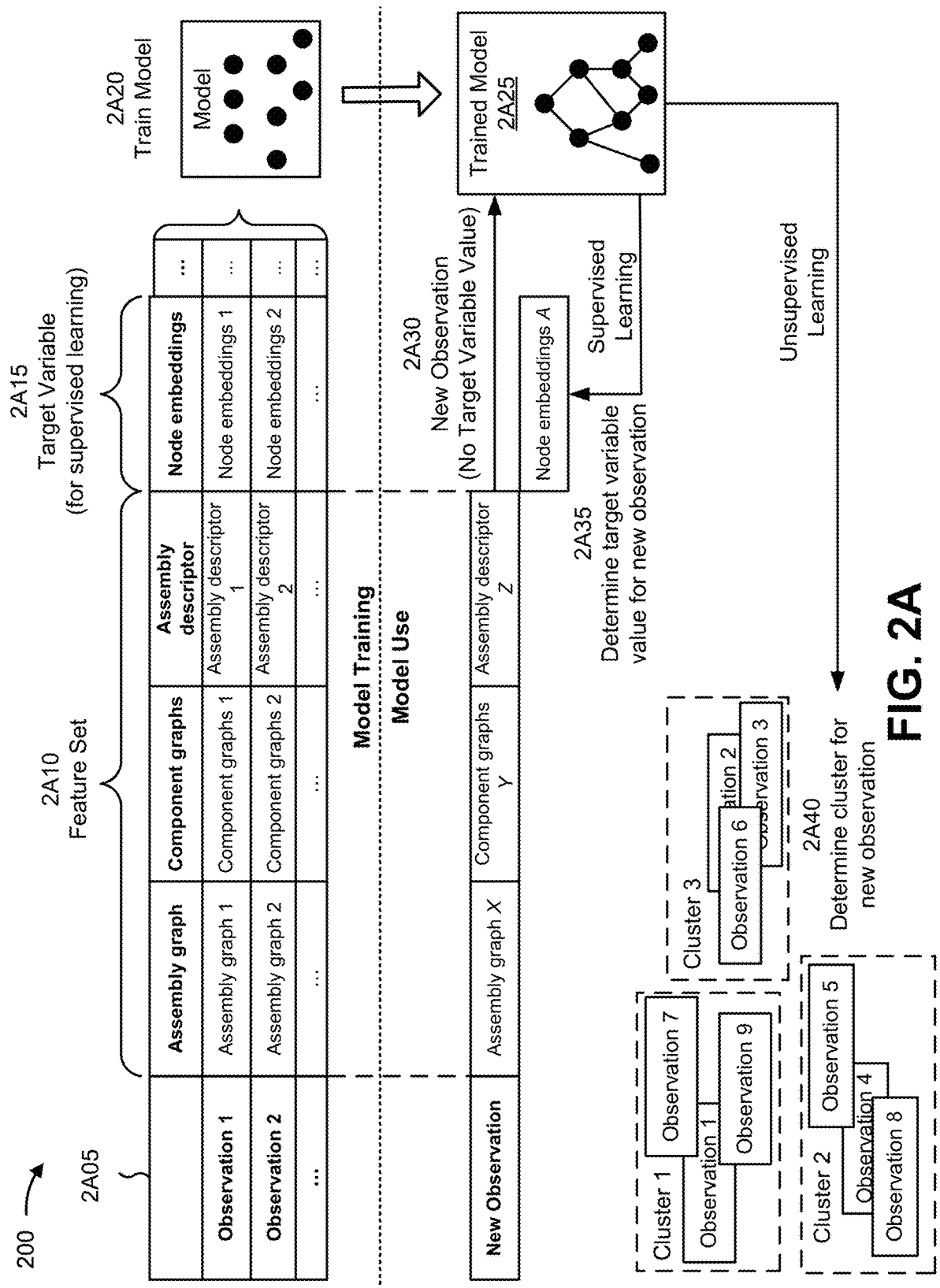
FIGS. 2A-2C are diagrams illustrating an example of training and using a machine learning model.

FIG. 2A is a diagram illustrating an example 200 of training and using a machine learning model for generating robotic assembly instructions from 3D CAD models. The machine learning model training and usage described herein may be performed using a machine learning system. The machine learning system may include or may be included in a computing device, a server, a cloud computing environment, and/or the like, such as the planning system described in more detail elsewhere herein.

As shown by reference number 205, a machine learning model may be trained using a set of observations. The set of observations may be obtained from historical data, such as data gathered during one or more processes described herein. In some implementations, the machine learning system may receive the set of observations (e.g., as input) from the planning system, as described elsewhere herein.

As shown by reference number 210, the set of observations includes a feature set. The feature set may include a set of variables, and a variable may be referred to as a feature. A specific observation may include a set of variable values (or feature values) corresponding to the set of variables. In some implementations, the machine learning system may determine variables for a set of observations and/or variable values for a specific observation based on input received from the planning system. For example, the machine learning system may identify a feature set (e.g., one or more features and/or feature values) by extracting the feature set from structured data, by performing natural language processing to extract the feature set from unstructured data, by receiving input from an operator, and/or the like.

As an example, a feature set for a set of observations may include a first feature of assembly graph, a second feature of component graphs, a third feature of assembly descriptor, and so on. As shown, for a first observation, the first feature may have a value assembly graph 1, the second feature may have a value component graphs 1, the third feature may have a value assembly descriptor 1, and so on. These features and feature values are provided as examples and may differ in other examples.

As shown by reference number 215, the set of observations may be associated with a target variable. The target variable may represent a variable having a numeric value, may represent a variable having a numeric value that falls within a range of values or has some discrete possible values, may represent a variable that is selectable from one of multiple options (e.g., one of multiple classes, classifications, labels, and/or the like), may represent a variable having a Boolean value, and/or the like. A target variable may be associated with a target variable value, and a target variable value may be specific to an observation. In example 200, the target variable has a value of node embeddings for the observations.

The target variable may represent a value that a machine learning model is being trained to predict, and the feature set may represent the variables that are input to a trained machine learning model to predict a value for the target variable. The set of observations may include target variable values so that the machine learning model can be trained to recognize patterns in the feature set that lead to a target variable value. A machine learning model that is trained to predict a target variable value may be referred to as a supervised learning model.

In some implementations, the machine learning model may be trained on a set of observations that do not include a target variable. This may be referred to as an unsupervised learning model. In this case, the machine learning model may learn patterns from the set of observations without labeling or supervision, and may provide output that indicates such patterns, such as by using clustering and/or association to identify related groups of items within the set of observations.

As shown by reference number 220, the machine learning system may train a machine learning model using the set of observations and using one or more machine learning algorithms, such as a regression algorithm, a decision tree algorithm, a neural network algorithm, a k-nearest neighbor algorithm, a support vector machine algorithm, and/or the like. After training, the machine learning system may store the machine learning model as a trained machine learning model 225 to be used to analyze new observations.

As shown by reference number 230, the machine learning system may apply the trained machine learning model 225 to a new observation, such as by receiving a new observation and inputting the new observation to the trained machine learning model 225. As shown, the new observation may include a first feature of assembly graph X, a second feature of component graphs Y, a third feature of assembly descriptor Z, and so on, as an example. The machine learning system may apply the trained machine learning model 225 to the new observation to generate an output (e.g., a result). The type of output may depend on the type of machine learning model and/or the type of machine learning task being performed. For example, the output may include a predicted value of a target variable, such as when supervised learning is employed. Additionally, or alternatively, the output may include information that identifies a cluster to which the new observation belongs, information that indicates a degree of similarity between the new observation and one or more other observations, and/or the like, such as when unsupervised learning is employed.

As an example, the trained machine learning model 225 may predict a value of node embeddings A for the target variable of the node embeddings for the new observation, as shown by reference number 235. Based on this prediction, the machine learning system may provide a first recommendation, may provide output for determination of a first recommendation, may perform a first automated action, may cause a first automated action to be performed (e.g., by instructing another device to perform the automated action), and/or the like.

In some implementations, the trained machine learning model 225 may classify (e.g., cluster) the new observation in a cluster, as shown by reference number 240. The observations within a cluster may have a threshold degree of similarity. As an example, if the machine learning system classifies the new observation in a first cluster (e.g., an assembly graph cluster), then the machine learning system may provide a first recommendation. Additionally, or alternatively, the machine learning system may perform a first automated action and/or may cause a first automated action to be performed (e.g., by instructing another device to perform the automated action) based on classifying the new observation in the first cluster.

As another example, if the machine learning system were to classify the new observation in a second cluster (e.g., a component graphs cluster), then the machine learning system may provide a second (e.g., different) recommendation and/or may perform or cause performance of a second (e.g., different) automated action.

In some implementations, the recommendation and/or the automated action associated with the new observation may be based on a target variable value having a particular label (e.g., classification, categorization, and/or the like), may be based on whether a target variable value satisfies one or more thresholds (e.g., whether the target variable value is greater than a threshold, is less than a threshold, is equal to a threshold, falls within a range of threshold values, and/or the like), may be based on a cluster in which the new observation is classified, and/or the like.

In this way, the machine learning system may apply a rigorous and automated process to determine a target variable (e.g., node embeddings). The machine learning system enables recognition and/or identification of tens, hundreds, thousands, or millions of features and/or feature values for tens, hundreds, thousands, or millions of observations, thereby increasing accuracy and consistency and reducing delay associated with determining a target variable relative to requiring computing resources to be allocated for tens, hundreds, or thousands of operators to manually determine a target variable.

Figure 2B:
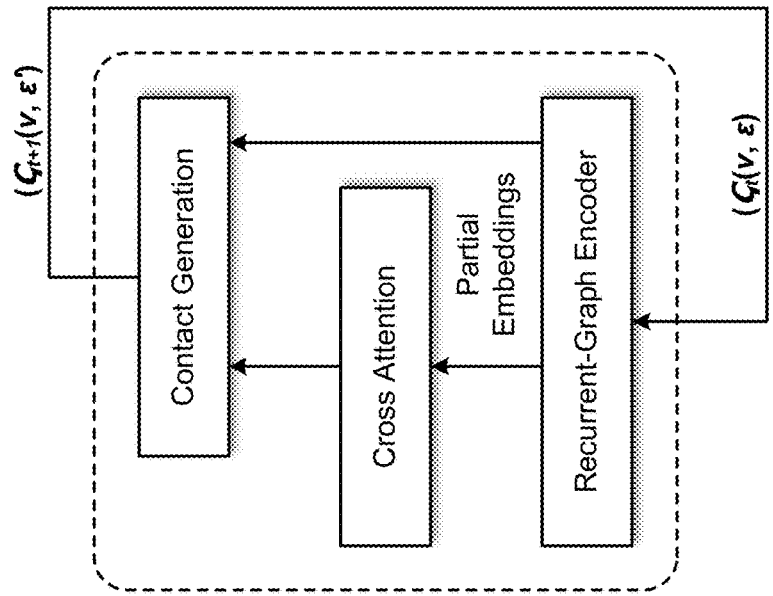
Figure 2C:
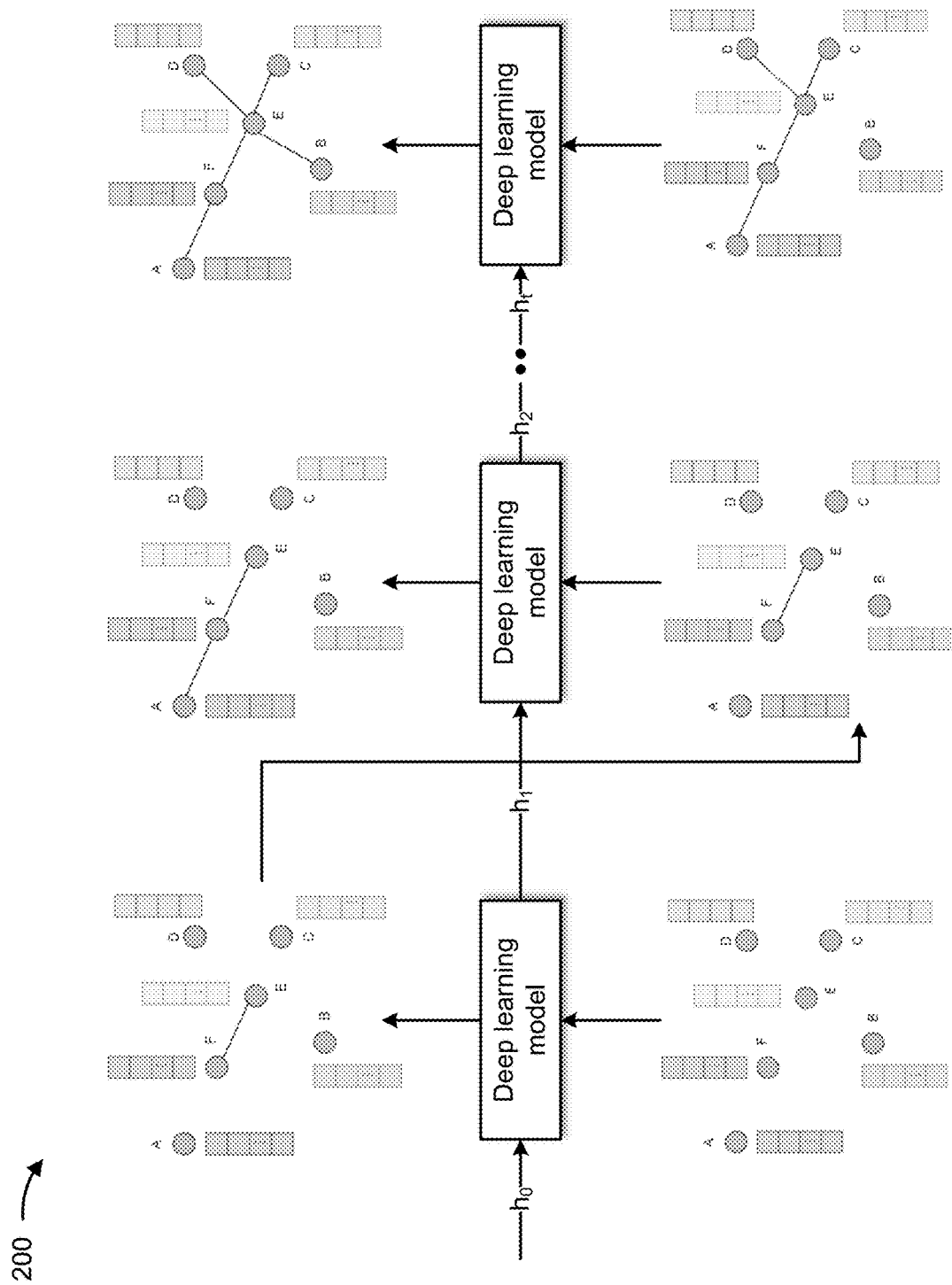

FIGS. 2B and 2C are diagrams illustrating an example 200 of using a deep learning model for generating robotic assembly instructions from 3D CAD models. As shown in FIG. 2B, a deep learning model may include a recurrent-graph encoder, a cross attention component, and a contact generation component. The recurrent graph encoder may receive a current state of an assembly graph ($G_t(v, \varepsilon)$, where v is a set of component nodes and $\varepsilon$ is a set of edges) and may sequentially generate updated node embeddings (e.g., partial embeddings). The cross attention component may receive the partial embeddings and may calculate a relation between various partial embeddings (e.g., a parts interrelation) and cross attention between the partial embeddings. The contact generation component may receive the partial embeddings and the cross attention, and may process the partial embeddings and the cross attention. The contact generation component may update the state of the assembly graph by adding new links (e.g., edges) based on processing the partial embeddings and the cross attention. The contact generation component may generate an updated assembly graph ($G_{t+1}(v, \varepsilon')$). Given partial feature vectors, the deep learning model may focus on the most informative descriptors and may generate a single feature vector that captures the interrelation between the partial feature vectors.

As shown in FIG. 2C, the deep learning model may receive a current state of the assembly graph ($G_t(v, \varepsilon)$ and a hidden state (h) of a node of the assembly graph at different time periods. The deep learning model may update the state of the assembly graph (e.g., at each time period) by adding new links (e.g., edges) and to generate the updated assembly graph ($G_{t+1}(v, \varepsilon')$). For example, the deep learning model may receive the current state of the assembly graph ($G_t(v, \varepsilon)$ and a hidden state ($h_0$) of a node of the assembly graph at a first time period. The deep learning model may update the state of the assembly graph (e.g., at the first time period) by adding a new link (e.g., between nodes E and F) and to generate the updated assembly graph ($G_{t+1}(v, \varepsilon')$). The deep learning model may continue this process until the deep learning model receives the current state of the assembly graph ($G_t(v, \varepsilon)$ and a hidden state ($h_t$) of a node of the assembly graph at a final time period. The deep learning model may update the state of the assembly graph (e.g., at the final time period) by adding a new link (e.g., between nodes B and E) and to generate the final assembly graph ($G_{t+1}(v, \varepsilon')$) (e.g., that interconnects nodes A-F).

As indicated above, FIGS. 2A-2C are provided as examples. Other examples may differ from what is described in connection with FIGS. 2A-2C.

Figure 3:
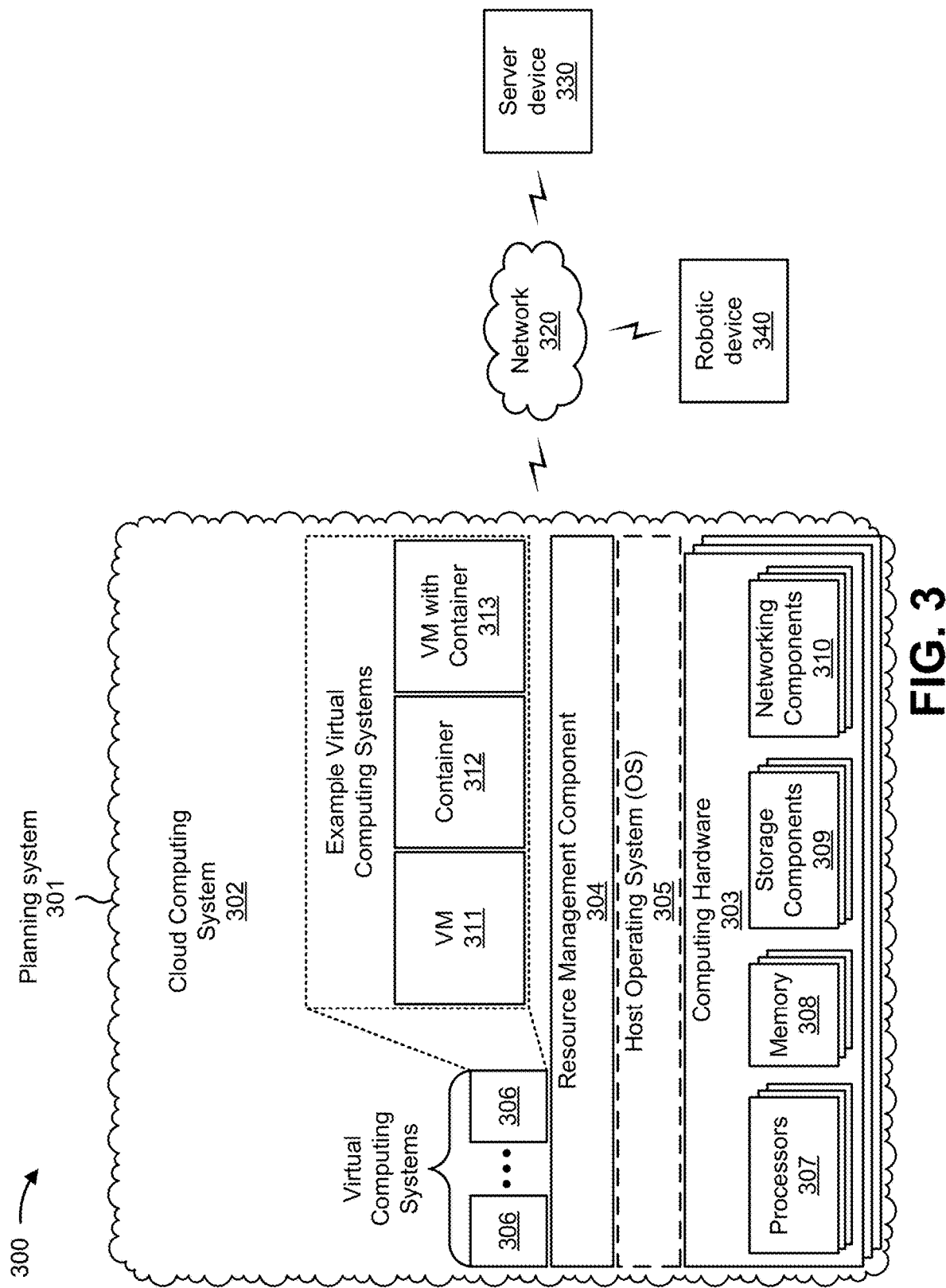
FIG. 3 is a diagram of an example environment in which systems and/or methods described herein may be implemented.

FIG. 3 is a diagram of an example environment 300 in which systems and/or methods described herein may be implemented. As shown in FIG. 3, the environment 300 may include a planning system 301, which may include one or more elements of and/or may execute within a cloud computing system 302. The cloud computing system 302 may include one or more elements 303-313, as described in more detail below. As further shown in FIG. 3, the environment 300 may include a network 320, a server device 330, and a robotic device 340. Devices and/or elements of the environment 300 may interconnect via wired connections and/or wireless connections.

The cloud computing system 302 includes computing hardware 303, a resource management component 304, a host operating system (OS) 305, and/or one or more virtual computing systems 306. The resource management component 304 may perform virtualization (e.g., abstraction) of the computing hardware 303 to create the one or more virtual computing systems 306. Using virtualization, the resource management component 304 enables a single computing device (e.g., a computer, a server, and/or the like) to operate like multiple computing devices, such as by creating multiple isolated virtual computing systems 306 from the computing hardware 303 of the single computing device. In this way, the computing hardware 303 can operate more efficiently, with lower power consumption, higher reliability, higher availability, higher utilization, greater flexibility, and lower cost than using separate computing devices.

The computing hardware 303 includes hardware and corresponding resources from one or more computing devices. For example, the computing hardware 303 may include hardware from a single computing device (e.g., a single server) or from multiple computing devices (e.g., multiple servers), such as multiple computing devices in one or more data centers. As shown, the computing hardware 303 may include one or more processors 307, one or more memories 308, one or more storage components 309, and/or one or more networking components 310. Examples of a processor, a memory, a storage component, and a networking component (e.g., a communication component) are described elsewhere herein.

The resource management component 304 includes a virtualization application (e.g., executing on hardware, such as the computing hardware 303) capable of virtualizing the computing hardware 303 to start, stop, and/or manage the one or more virtual computing systems 306. For example, the resource management component 304 may include a hypervisor (e.g., a bare-metal or Type 1 hypervisor, a hosted or Type 2 hypervisor, and/or the like) or a virtual machine monitor, such as when the virtual computing systems 306 are virtual machines 311. Additionally, or alternatively, the resource management component 304 may include a container manager, such as when the virtual computing systems 306 are containers 312. In some implementations, the resource management component 304 executes within and/or in coordination with a host operating system 305.

A virtual computing system 306 includes a virtual environment that enables cloud-based execution of operations and/or processes described herein using computing hardware 303. As shown, a virtual computing system 306 may include a virtual machine 311, a container 312, a hybrid environment 313 that includes a virtual machine and a container, and/or the like. A virtual computing system 306 may execute one or more applications using a file system that includes binary files, software libraries, and/or other resources required to execute applications on a guest operating system (e.g., within the virtual computing system 306) or the host operating system 305.

Although the planning system 301 may include one or more elements 303-313 of the cloud computing system 302, may execute within the cloud computing system 302, and/or may be hosted within the cloud computing system 302, in some implementations, the planning system 301 may not be cloud-based (e.g., may be implemented outside of a cloud computing system) or may be partially cloud-based. For example, the planning system 301 may include one or more devices that are not part of the cloud computing system 302, such as a device 400 of FIG. 4, which may include a standalone server or another type of computing device. The planning system 301 may perform one or more operations and/or processes described in more detail elsewhere herein.

The network 320 includes one or more wired and/or wireless networks. For example, the network 320 may include a cellular network, a public land mobile network (PLMN), a local area network (LAN), a wide area network (WAN), a private network, the Internet, and/or the like, and/or a combination of these or other types of networks. The network 320 enables communication among the devices of the environment 300.

The server device 330 may include one or more devices capable of receiving, generating, storing, processing, providing, and/or routing information, as described elsewhere herein. The server device 330 may include a communication device and/or a computing device. For example, the server device 330 may include a server, such as an application server, a client server, a web server, a database server, a host server, a proxy server, a virtual server (e.g., executing on computing hardware), or a server in a cloud computing system. In some implementations, the server device 330 may include computing hardware used in a cloud computing environment.

The robotic device 340 may include one or more devices capable of receiving, generating, storing, processing, providing, and/or routing information, as described elsewhere herein. For example, the robotic device 340 may include an automatically operated machine that replaces human effort associated with construction of products, assembly of products, and/or the like. In some implementations, the robotic device 340 may include an autonomous mobile robot (AMR), an automated guided vehicle (AGV), an articulated robot, a humanoid, a cobot, a hybrid robot, and/or the like. In some implementations, the robotic device 340 may include a communication device and/or a computing device.

The number and arrangement of devices and networks shown in FIG. 3 are provided as an example. In practice, there may be additional devices and/or networks, fewer devices and/or networks, different devices and/or networks, or differently arranged devices and/or networks than those shown in FIG. 3. Furthermore, two or more devices shown in FIG. 3 may be implemented within a single device, or a single device shown in FIG. 3 may be implemented as multiple, distributed devices. Additionally, or alternatively, a set of devices (e.g., one or more devices) of the environment 300 may perform one or more functions described as being performed by another set of devices of the environment 300.

Figure 4:
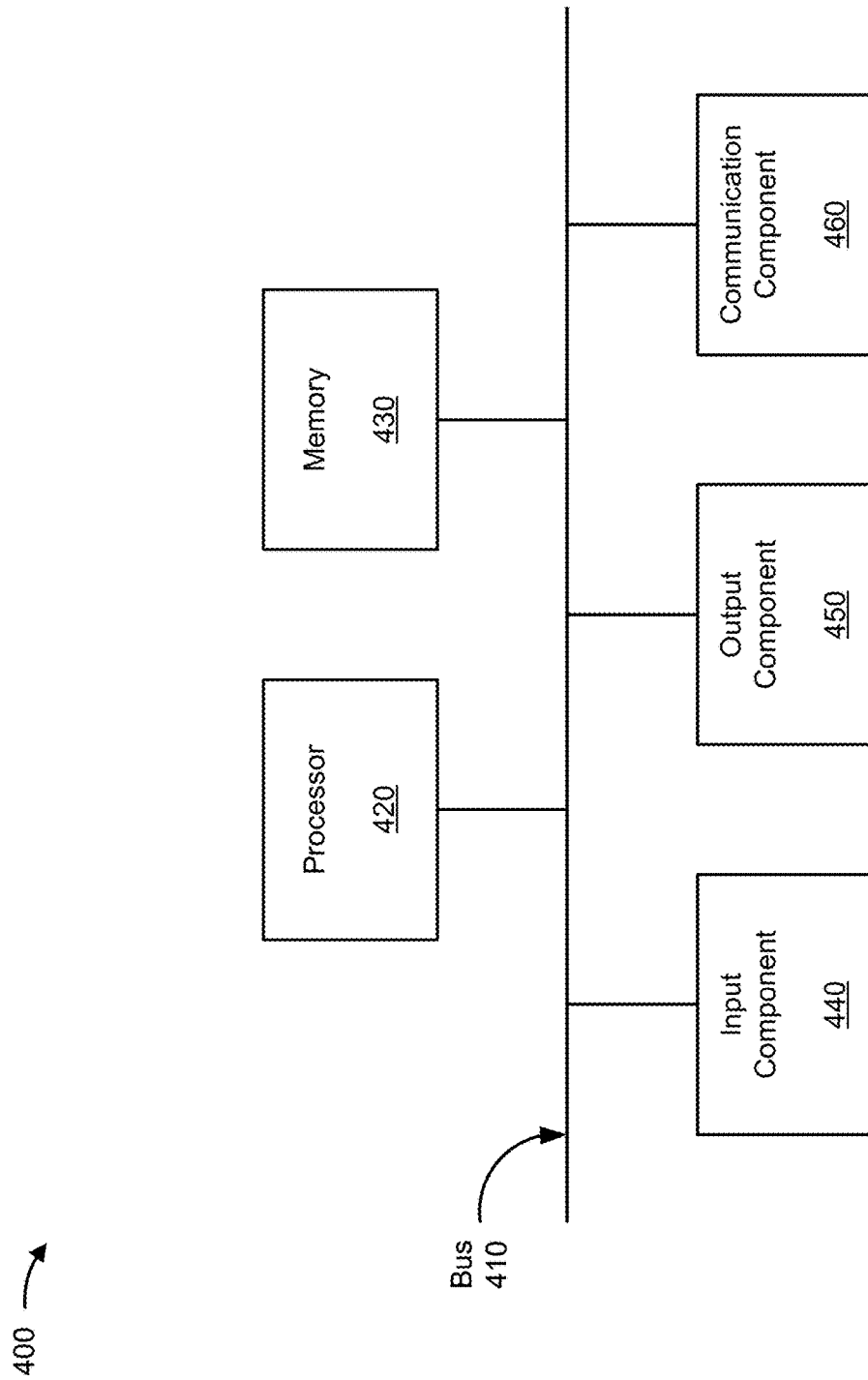
FIG. 4 is a diagram of example components of one or more devices of FIG. 3.

FIG. 4 is a diagram of example components of a device 400, which may correspond to the planning system 301, the server device 330, and/or the robotic device 340. In some implementations, the planning system 301, the server device 330, and/or the robotic device 340 may include one or more devices 400 and/or one or more components of the device 400. As shown in FIG. 4, the device 400 may include a bus 410, a processor 420, a memory 430, an input component 440, an output component 450, and a communication component 460.

The bus 410 includes a component that enables wired and/or wireless communication among the components of device 400. The processor 420 includes a central processing unit, a graphics processing unit, a microprocessor, a controller, a microcontroller, a digital signal processor, a field-programmable gate array, an application-specific integrated circuit, and/or another type of processing component. The processor 420 is implemented in hardware, firmware, or a combination of hardware and software. In some implementations, the processor 420 includes one or more processors capable of being programmed to perform a function. The memory 430 includes a random-access memory, a read only memory, and/or another type of memory (e.g., a flash memory, a magnetic memory, and/or an optical memory).

The input component 440 enables the device 400 to receive input, such as user input and/or sensed inputs. For example, the input component 440 may include a touch screen, a keyboard, a keypad, a mouse, a button, a microphone, a switch, a sensor, a global positioning system component, an accelerometer, a gyroscope, an actuator, and/or the like. The output component 450 enables the device 400 to provide output, such as via a display, a speaker, and/or one or more light-emitting diodes. The communication component 460 enables the device 400 to communicate with other devices, such as via a wired connection and/or a wireless connection. For example, the communication component 460 may include a receiver, a transmitter, a transceiver, a modem, a network interface card, an antenna, and/or the like.

The device 400 may perform one or more processes described herein. For example, a non-transitory computer-readable medium (e.g., the memory 430) may store a set of instructions (e.g., one or more instructions, code, software code, program code, and/or the like) for execution by the processor 420. The processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. The device 400 may include additional components, fewer components, different components, or differently arranged components than those shown in FIG. 4. Additionally, or alternatively, a set of components (e.g., one or more components) of the device 400 may perform one or more functions described as being performed by another set of components of the device 400.

Figure 5:
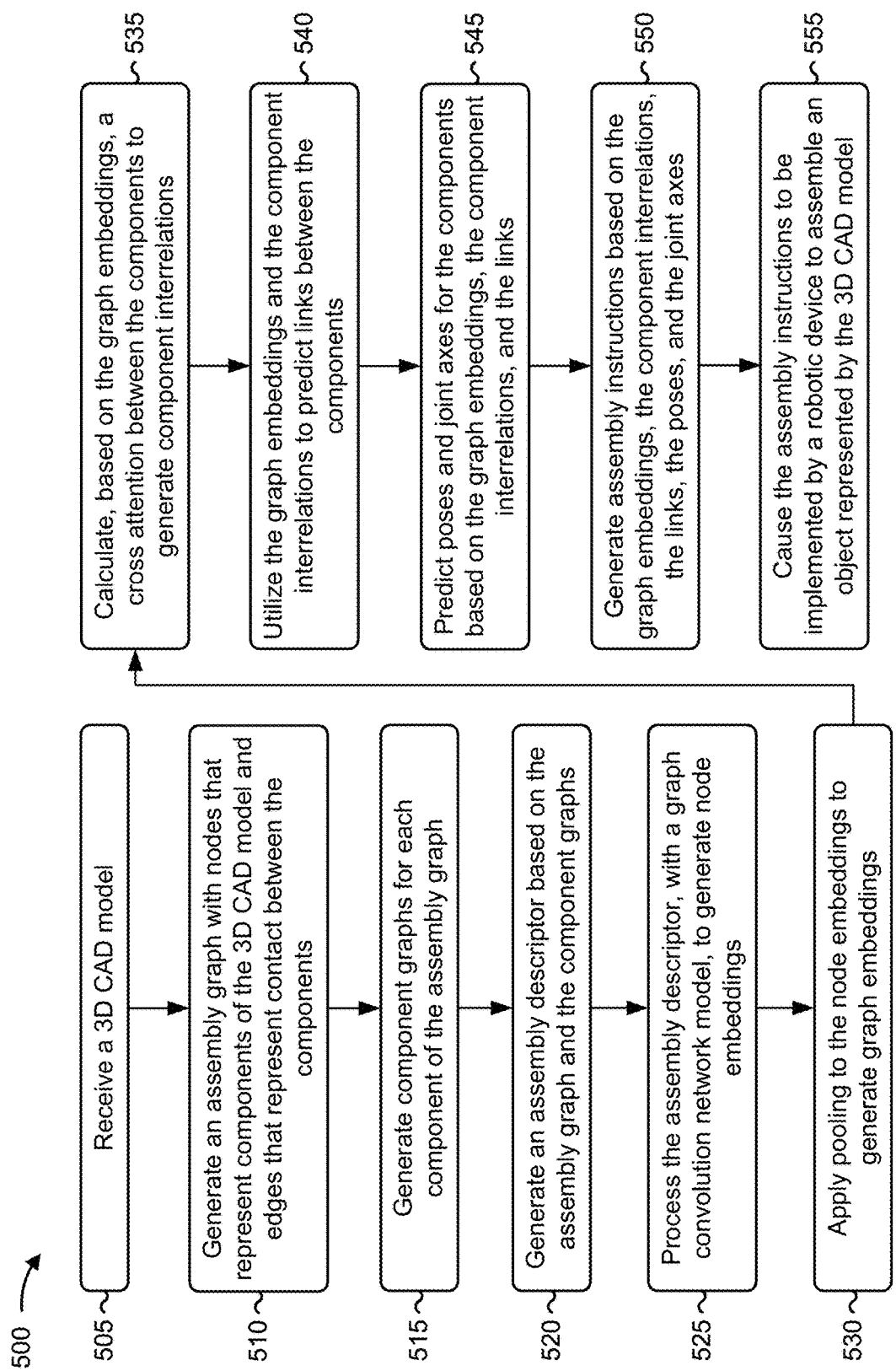
FIG. 5 is a flowchart of an example process for generating robotic assembly instructions from three-dimensional (3D) computer-aided design (CAD) models.

FIG. 5 is a flowchart of an example process 500 for generating robotic assembly instructions from 3D CAD models. In some implementations, one or more process blocks of FIG. 5 may be performed by a device (e.g., the planning system 301). In some implementations, one or more process blocks of FIG. 5 may be performed by another device or a group of devices separate from or including the device, such as a server device (e.g., the server device 330) and/or a robotic device (e.g., the robotic device 340). Additionally, or alternatively, one or more process blocks of FIG. 5 may be performed by one or more components of the device 400, such as the processor 420, the memory 430, the input component 440, the output component 450, and/or the communication component 460.

As shown in FIG. 5, process 500 may include receiving a 3D CAD model (block 505). For example, the device may receive a 3D CAD model, as described above.

As further shown in FIG. 5, process 500 may include generating an assembly graph with nodes that represent components of the 3D CAD model and edges that represent contact between the components (block 510). For example, the device may generate an assembly graph with nodes that represent components of the 3D CAD model and edges that represent contact between the components, as described above. In some implementations, each of the edges indicates one of contact between respective components or no contact between respective components.

As further shown in FIG. 5, process 500 may include generating component graphs for each component of the assembly graph (block 515). For example, the device may generate component graphs for each component of the assembly graph, as described above. In some implementations, each of the component graphs includes one or more nodes representing one or more faces of a corresponding component and one or more edges connecting the one or more nodes representing the one or more faces. In some implementations, each of the component graphs includes at least one node representing a face of a corresponding component, the at least one node includes a set of features, and the set of features includes at least one spatial feature and at least one structural feature.

As further shown in FIG. 5, process 500 may include generating an assembly descriptor based on the assembly graph and the component graphs (block 520). For example, the device may generate an assembly descriptor based on the assembly graph and the component graphs, as described above. In some implementations, the assembly descriptor includes the component graphs and corresponding adjacency matrices.

As further shown in FIG. 5, process 500 may include processing the assembly descriptor, with a graph convolution network model, to generate node embeddings (block 525). For example, the device may process the assembly descriptor, with a graph convolution network model, to generate node embeddings, as described above. In some implementations, the graph convolution network model includes a first part with first convolution layers and a second part with second convolution layers that are different than the first convolution layers. In some implementations, the assembly descriptor includes the component graphs and processing the assembly descriptor, with the graph convolution network model, to generate the node embeddings includes encoding features of the component graphs of the assembly descriptor to generate the node embeddings.

As further shown in FIG. 5, process 500 may include applying pooling to the node embeddings to generate graph embeddings (block 530). For example, the device may apply pooling to the node embeddings to generate graph embeddings, as described above. In some implementations, applying the pooling to the node embeddings to generate the graph embeddings includes one of applying average pooling to the node embeddings to generate the graph embeddings, applying maximum pooling to the node embeddings to generate the graph embeddings, or applying average pooling to the node embeddings to generate the graph embeddings.

As further shown in FIG. 5, process 500 may include calculating, based on the graph embeddings, a cross attention between the components to generate component interrelations (block 535). For example, the device may calculate, based on the graph embeddings, a cross attention between the components to generate component interrelations, as described above. In some implementations, calculating, based on the graph embeddings, the cross attention between the components to generate the component interrelations includes calculating, based on the graph embeddings, the cross attention between the components to generate a single feature vector that represents the component interrelations. In some implementations, calculating, based on the graph embeddings, the cross attention between the components to generate the component interrelations includes utilizing scaled dot product attention with the graph embeddings to transform the graph embeddings into self-attention feature vectors, aggregating the self-attention feature vectors into a matrix, and processing the matrix to generate a single feature vector that represents the component interrelations.

As further shown in FIG. 5, process 500 may include utilizing the graph embeddings and the component interrelations to predict links between the components (block 540). For example, the device may utilize the graph embeddings and the component interrelations to predict links between the components, as described above. In some implementations, utilizing the graph embeddings and the component interrelations to predict the links between the components includes processing the graph embeddings and the component interrelations, with a link prediction model or a link classification model, to predict the links between the components.

As further shown in FIG. 5, process 500 may include predicting poses and joint axes for the components based on the graph embeddings, the component interrelations, and the links (block 545). For example, the device may predict poses and joint axes for the components based on the graph embeddings, the component interrelations, and the links, as described above. In some implementations, each of the poses is a six degree of freedom pose for a corresponding component. In some implementations, each of the joint axes is a unit vector in three-dimensional space.

As further shown in FIG. 5, process 500 may include generating assembly instructions based on the graph embeddings, the component interrelations, the links, the poses, and the joint axes (block 550). For example, the device may generate assembly instructions based on the graph embeddings, the component interrelations, the links, the poses, and the joint axes, as described above.

As further shown in FIG. 5, process 500 may include causing the assembly instructions to be implemented by a robotic device to assemble an object represented by the 3D CAD model (block 555). For example, the device may cause the assembly instructions to be implemented by a robotic device to assemble an object represented by the 3D CAD model, as described above.

The foregoing disclosure provides illustration and description but is not intended to be exhaustive or to limit the implementations to the precise form disclosed. Modifications may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, and/or the like, depending on the context.

Although particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

In the preceding specification, various example embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method, comprising:
   receiving, by a device, a three-dimensional (3D) computer-aided design (CAD) model;
   generating, by the device, an assembly graph with nodes that represent components of the 3D CAD model and edges that represent contact between the components;
   generating, by the device, component graphs for each component of the assembly graph;
   generating, by the device, an assembly descriptor based on the assembly graph and the component graphs;
   processing, by the device, the assembly descriptor, with a graph convolution network model, to generate node embeddings;
   applying, by the device, pooling to the node embeddings to generate graph embeddings;
   calculating, by the device and based on the graph embeddings, a cross attention between the components to generate component interrelations;
   utilizing, by the device, the graph embeddings and the component interrelations to predict links between the components;
   predicting, by the device, poses and joint axes for the components based on the graph embeddings, the component interrelations, and the links;
   generating, by the device, assembly instructions based on the graph embeddings, the component interrelations, the links, the poses, and the joint axes; and
   causing, by the device, the assembly instructions to be implemented by a robotic device to assemble an object represented by the 3D CAD model.

2. The method of claim 1, wherein each of the edges indicates one of contact between respective components or no contact between respective components.

3. The method of claim 1, wherein each of the component graphs includes one or more nodes representing one or more faces of a corresponding component and one or more edges connecting the one or more nodes representing the one or more faces.

4. The method of claim 1, wherein each of the component graphs includes at least one node representing a face of a corresponding component,
   wherein the at least one node includes a set of features, and
   wherein the set of features includes at least one spatial feature and at least one structural feature.

5. The method of claim 1, wherein the assembly descriptor includes the component graphs and corresponding adjacency matrices.

6. The method of claim 1, wherein the graph convolution network model includes a first part with first convolution layers and a second part with second convolution layers that are different than the first convolution layers.

7. The method of claim 1, wherein the assembly descriptor includes the component graphs and processing the assembly descriptor, with the graph convolution network model, to generate the node embeddings comprises:
   encoding features of the component graphs of the assembly descriptor to generate the node embeddings.

8. A device, comprising:
   one or more memories; and
   one or more processors, coupled to the one or more memories, configured to:
   receive a three-dimensional (3D) computer-aided design (CAD) model;
   generate an assembly graph with nodes that represent components of the 3D CAD model and edges that represent contact between the components;
   generate component graphs for each component of the assembly graph;
   generate an assembly descriptor based on the assembly graph and the component graphs,
      wherein the assembly descriptor includes the component graphs and corresponding adjacency matrices;
   process the assembly descriptor, with a graph convolution network model, to generate node embeddings;
   apply pooling to the node embeddings to generate graph embeddings;
   calculate, based on the graph embeddings, a cross attention between the components to generate component interrelations;
   utilize the graph embeddings and the component interrelations to predict links between the components;
   predict poses and joint axes for the components based on the graph embeddings, the component interrelations, and the links;
   generate assembly instructions based on the graph embeddings, the component interrelations, the links, the poses, and the joint axes; and
   cause the assembly instructions to be implemented by a robotic device to assemble an object represented by the 3D CAD model.

9. The device of claim 8, wherein the one or more processors, to apply the pooling to the node embeddings to generate the graph embeddings, are configured to one of:
   apply average pooling to the node embeddings to generate the graph embeddings;
   apply maximum pooling to the node embeddings to generate the graph embeddings; or
   apply minimum pooling to the node embeddings to generate the graph embeddings.

10. The device of claim 8, wherein the one or more processors, to calculate, based on the graph embeddings, the cross attention between the components to generate the component interrelations, are configured to:
    calculate, based on the graph embeddings, the cross attention between the components to generate a single feature vector that represents the component interrelations.

11. The device of claim 8, wherein the one or more processors, to calculate, based on the graph embeddings, the cross attention between the components to generate the component interrelations, are configured to:
    utilize scaled dot product attention with the graph embeddings to transform the graph embeddings into self-attention feature vectors;
    aggregate the self-attention feature vectors into a matrix; and
    process the matrix to generate a single feature vector that represents the component interrelations.

12. The device of claim 8, wherein the one or more processors, to utilize the graph embeddings and the component interrelations to predict the links between the components, are configured to:
  process the graph embeddings and the component interrelations, with a link prediction model or a link classification model, to predict the links between the components.

13. The device of claim 8, wherein each of the poses is a six degree of freedom pose for a corresponding component.

14. The device of claim 8, wherein each of the joint axes is a unit vector in three-dimensional space.

15. A non-transitory computer-readable medium storing a set of instructions, the set of instructions comprising:
  one or more instructions that, when executed by one or more processors of a device, cause the device to:
    receive a three-dimensional (3D) computer-aided design (CAD) model;
    generate an assembly graph with nodes that represent components of the 3D CAD model and edges that represent contact between the components;
    generate component graphs for each component of the assembly graph,
      wherein each of the component graphs includes one or more nodes representing one or more faces of a corresponding component and one or more edges connecting the one or more nodes representing the one or more faces;
    generate an assembly descriptor based on the assembly graph and the component graphs;
    process the assembly descriptor, with a graph convolution network model, to generate node embeddings;
    apply pooling to the node embeddings to generate graph embeddings;
    calculate, based on the graph embeddings, a cross attention between the components to generate component interrelations;
    utilize the graph embeddings and the component interrelations to predict links between the components;
    predict poses and joint axes for the components based on the graph embeddings, the component interrelations, and the links;
    generate assembly instructions based on the graph embeddings, the component interrelations, the links, the poses, and the joint axes; and
    cause the assembly instructions to be implemented by a robotic device to assemble an object represented by the 3D CAD model.

16. The non-transitory computer-readable medium of claim 15, wherein each of the component graphs includes at least one node representing a face of a corresponding component,
  wherein the at least one node includes a set of features, and
  wherein the set of features includes at least one spatial feature and at least one structural feature.

17. The non-transitory computer-readable medium of claim 15, wherein the assembly descriptor includes the component graphs and the one or more instructions, that cause the device to process the assembly descriptor, with the graph convolution network model, to generate the node embeddings, cause the device to:
  encoding features of the component graphs of the assembly descriptor to generate the node embeddings.

18. The non-transitory computer-readable medium of claim 15, wherein the one or more instructions, that cause the device to apply the pooling to the node embeddings to generate the graph embeddings, cause the device to one of:
  apply average pooling to the node embeddings to generate the graph embeddings;
  apply maximum pooling to the node embeddings to generate the graph embeddings; or
  apply minimum pooling to the node embeddings to generate the graph embeddings.

19. The non-transitory computer-readable medium of claim 15, wherein the one or more instructions, that cause the device to calculate, based on the graph embeddings, the cross attention between the components to generate the component interrelations, cause the device to:
  calculate, based on the graph embeddings, the cross attention between the components to generate a single feature vector that represents the component interrelations.

20. The non-transitory computer-readable medium of claim 15, wherein the one or more instructions, that cause the device to calculate, based on the graph embeddings, the cross attention between the components to generate the component interrelations, cause the device to:
  utilize scaled dot product attention with the graph embeddings to transform the graph embeddings into self-attention feature vectors;
  aggregate the self-attention feature vectors into a matrix; and
  process the matrix to generate a single feature vector that represents the component interrelations.

* * * * *